United States Patent
Nagata et al.

(10) Patent No.: US 6,487,144 B2
(45) Date of Patent: Nov. 26, 2002

(54) DISK RECORDING MEDIUM INCLUDING DATA PRE-FORMATTED-DATA-RECORDED HEADER HAVING FIRST AND SECOND IDENTICAL ADDRESS NUMBERS RADIALLY DISPLACED FROM EACH OTHER ON OPPOSITE SIDES OF GROOVE OR LAND TRACK CENTER LINE, AND DISK DRIVE UNIT FOR USE WITH THE RECORDING MEDIUM

(75) Inventors: Masayoshi Nagata, Kanagawa; Junichi Horigome, Tokyo; Motoyasu Yumita, Kanagawa, all of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/750,495

(22) Filed: Dec. 27, 2000

(65) Prior Publication Data

US 2001/0036133 A1 Nov. 1, 2001

(30) Foreign Application Priority Data

Dec. 28, 1999 (JP) ............................................. 11-374184

(51) Int. Cl.[7] .................................................. G11B 7/24
(52) U.S. Cl. .................................. 369/30.12; 369/275.3
(58) Field of Search ........................... 369/275.3, 279.4, 369/44.41, 30.12

(56) References Cited

U.S. PATENT DOCUMENTS

| 5,508,995 | A | | 4/1996 | Moriya et al. |
| 5,936,932 | A | * | 8/1999 | Nakane et al. ............ 369/275.3 |
| 6,249,489 | B1 | * | 6/2001 | Fujii et al. ............ 369/275.4 X |
| 6,172,960 | B1 | * | 1/2002 | Takemura et al. ....... 369/275.3 |

FOREIGN PATENT DOCUMENTS

| EP | 0 727 779 | 8/1996 |
| EP | 0 757 343 | 2/1997 |
| EP | 0 886 266 | 12/1998 |

* cited by examiner

Primary Examiner—Aristotelis Psitos
(74) Attorney, Agent, or Firm—Oblon, Spivak, McClelland, Maier & Neustadt, P.C.

(57) ABSTRACT

A disk recording medium has reliability of address reading which is maintained equivalently to the conventional disk recording medium by recording a first address and a second address that are identical in a header area. By arranging the first and second addresses to be reversely displaced from the center line of a groove track or a land track to the radial direction of the medium, the distance between the first and second addresses when they are adjacent is increased, which eliminates the influence of crosstalk. This avoids redundancy of the header area and enables high-density recording to the disk recording medium.

9 Claims, 17 Drawing Sheets

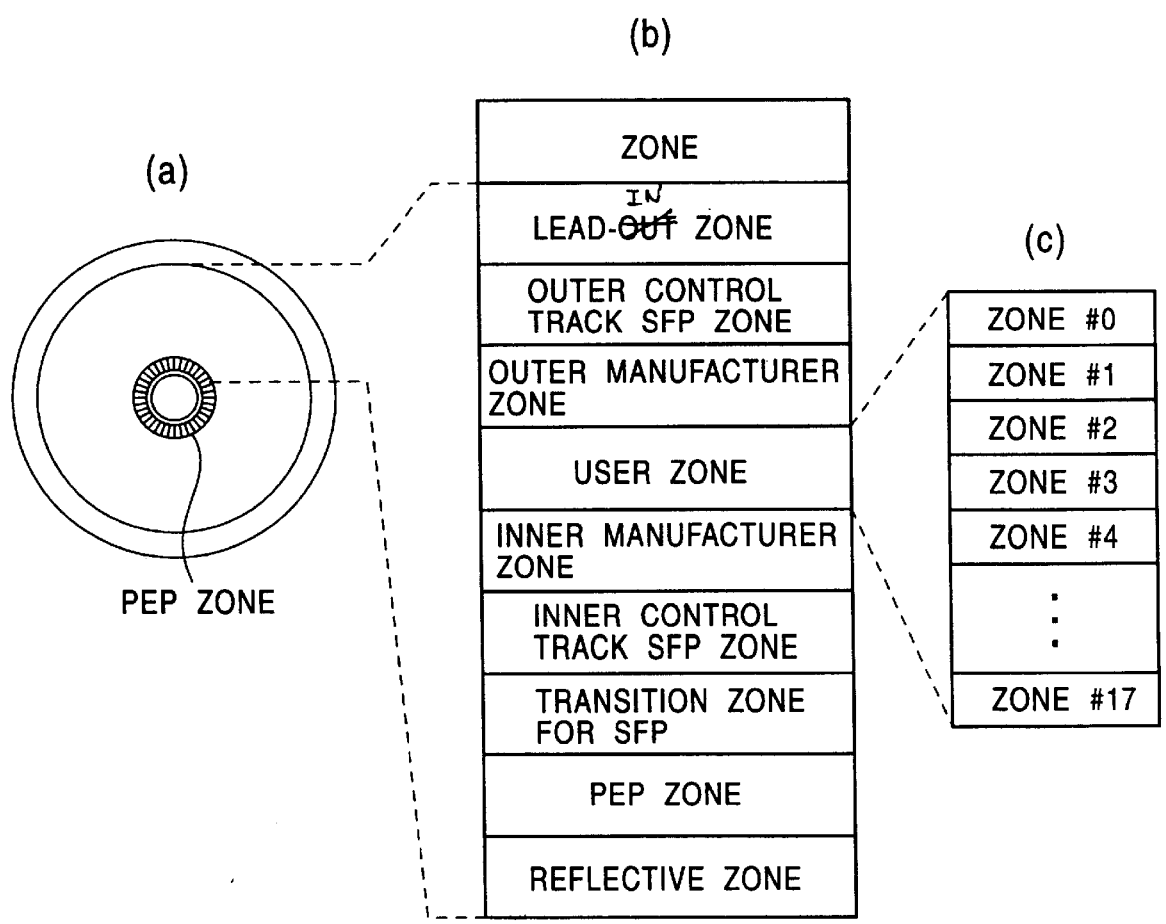

FIG. 2

| | RADIAL POSITION (mm) | LOGICAL TRACK | |
|---|---|---|---|
| | | LOGICAL TRACK NUMBER | NUMBER |
| -LEAD-OUT ZONE (IN) | 62.50 to 62.30 | -1568 to -785 | 784 |
| -OUTER CONTROL TRACK SFP ZONE | 62.30 to 62.25 | -784 to -593 | 192 |
| -OUTER MANUFACTURER ZONE | 62.25 to 62.10 | -592 to -1 | 592 |
| (GUARD BAND) | (62.25 to 62.25) | -592 to -580 | 13 |
| (TEST ZONE FOR MANUFACTURES) | (62.25 to 62.24) | -579 to -554 | 26 |
| (TEST ZONE FOR DRIVES) | (62.24 to 62.10) | -553 to -14 | 540 |
| (GUARD BAND) | (62.10 to 62.10) | -13 to -1 | 13 |
| -USER ZONE | 62.10 to 29.79 | 0 to 93059 | 93060 |
| -INNER MANUFACTURER ZONE | 29.79 to 29.55 | 93060 to 93494 | 435 |
| (GUARD BAND) | (29.79 to 29.78) | 93060 to 93066 | 7 |
| (TEST ZONE FOR DRIVES) | (29.78 to 29.56) | 93067 to 93474 | 408 |
| (TEST ZONE FOR MANUFACTURES) | (29.56 to 29.55) | 93475 to 93487 | 13 |
| (GUARD BAND) | (29.55 to 29.55) | 93488 to 93494 | 7 |
| -INNER CONTROL TRACK SFP ZONE | 29.55 to 29.5171 | 93495 to 93554 | 60 |
| -TRANSITION ZONE FOR SFP | 29.52 to 29.50 | 93555 to 93585 | 31 |
| -CONTROL TRACK PFP ZONE | 29.50 to 29.00 | — | — |
| -REFLECTIVE ZONE | 29.00 to 27.00 | — | — |

TRACK PITCH : 0.68 (μm/bit)
[14 X 4096 byte/SECTORS]

FIG. 3

| ZONE NUMBER | GROOVE(G) LAND(L) | PHYSICAL TRACKS/ ZONE | RADIAL POSITION (INNER) | NUMBER OF SECTORS/ PHYSICAL TRACK | RECORDING REGION DENSITY (μm/bit) | NUMBER OF LOGICAL TRACKS (G) | NUMBER OF LOGICAL TRACKS (L) | START OF LOGICAL TRACK NUMBER (G) | START OF LOGICAL TRACK NUMBER (L) | TOTAL OF NUMBER OF LANDS AND NUMBER OF GROOVES |
|---|---|---|---|---|---|---|---|---|---|---|
| #0 | G / L | 2640 | 60.30 | 32 | 2.89E-06 | 7040 | — | 0 | 0 | 84480 |
| #1 | G / L | 2640 | 58.51 | 31 | 2.89E-06 | — | 7040 | 7040 | 7040 | 81840 |
| #2 | G / L | 2640 | 56.71 | 30 | 2.90E-06 | 6820 | — | 13860 | 13860 | 79200 |
| #3 | G / L | 2640 | 54.92 | 29 | 2.90E-06 | — | 6600 | 20460 | 20460 | 76560 |
| #4 | G / L | 2640 | 53.12 | 28 | 2.91E-06 | 6380 | — | 26840 | 26840 | 73960 |
| #5 | G / L | 2640 | 51.33 | 27 | 2.91E-06 | — | 6160 | 33000 | 33000 | 71280 |
| #6 | G / L | 2640 | 49.53 | 26 | 2.92E-06 | 5940 | — | 38940 | 38940 | 68640 |
| #7 | G / L | 2640 | 47.74 | 25 | 2.93E-06 | — | 5720 | 44660 | 44660 | 66000 |
| #8 | G / L | 2640 | 45.94 | 24 | 2.93E-06 | 5500 | — | 50160 | 50160 | 63360 |
| #9 | G / L | 2640 | 44.15 | 23 | 2.94E-06 | — | 5280 | 55440 | 55440 | 60720 |
| #10 | G / L | 2640 | 42.35 | 22 | 2.95E-06 | 5060 | — | 60500 | 60500 | 58080 |
| #11 | G / L | 2640 | 40.56 | 21 | 2.96E-06 | — | 4840 | 65340 | 65340 | 55440 |
| #12 | G / L | 2640 | 38.76 | 20 | 2.97E-06 | 4620 | — | 69960 | 69960 | 52800 |
| #13 | G / L | 2640 | 36.97 | 19 | 2.98E-06 | — | 4400 | 74360 | 74360 | 50160 |
| #14 | G / L | 2640 | 35.17 | 18 | 3.00E-06 | 4180 | — | 78540 | 78540 | 47520 |
| #15 | G / L | 2640 | 33.38 | 17 | 3.01E-06 | — | 3960 | 82500 | 82500 | 44880 |
| #16 | G / L | 2640 | 31.58 | 16 | 3.03E-06 | 3740 | — | 86240 | 86240 | 42240 |
| #17 | G / L | 2640 | 29.79 | 15 | 3.04E-06 | — | 3520 | 89760 | 89760 | 39600 |

USER ZONE

FIG. 6

| COLUMN. NO. → | 0 | 1 | 2 | 3 | | 14 | 15 | 16 | | 26 | 27 | 28 | | 34 | 35 | 36 | 37 | 38 | 39 | ROW.NO |
|---|---|---|---|---|---|---|---|---|---|---|---|---|---|---|---|---|---|---|---|---|
| SB1 SB2 SB3 SB4 | | | | | | | | | | | | | | | | | | | | 102 |
| | D1 | D2 | D3 | D4 | | D15 | D16 | D17 | | D27 | D28 | D29 | | D35 | D36 | D37 | D38 | D39 | D40 | 101 |
| RS1 | D41 | D42 | D43 | D44 | | D55 | D56 | D57 | | D67 | D68 | D69 | | D75 | D76 | D77 | D78 | D79 | D80 | 100 |
| | D81 | D82 | D83 | D84 | | D95 | D96 | D97 | | D107 | D108 | D109 | | D115 | D116 | D117 | D118 | D119 | D120 | 99 |
| RS2 | D121 | D122 | D123 | D124 | | D135 | D136 | D137 | | D147 | D148 | D149 | | D155 | D156 | D157 | D158 | D159 | D160 | 98 |
| | D161 | D162 | D163 | D164 | | D175 | D176 | D177 | | D187 | D188 | D189 | | D195 | D196 | D197 | D198 | D199 | D200 | 97 |
| RS3 | D201 | D202 | D203 | D204 | | D215 | D216 | D217 | | D227 | D228 | D229 | | D235 | D236 | D237 | D238 | D239 | D240 | 96 |
| | D241 | D242 | D243 | D244 | | D255 | D256 | D257 | | D267 | D268 | D269 | | D275 | D276 | D277 | D278 | D279 | D280 | 95 |
| RS4 | D281 | D282 | D283 | D284 | | D295 | D296 | D297 | | D307 | D308 | D309 | | D315 | D316 | D317 | D318 | D319 | D320 | 94 |
| | D321 | D322 | D323 | D324 | | D335 | D336 | D337 | | D347 | D348 | D349 | | D355 | D356 | D357 | D358 | D359 | D360 | 93 |
| | D361 | D362 | D363 | D364 | | D375 | D376 | D377 | | D387 | D388 | D389 | | D395 | D396 | D397 | D398 | D399 | D400 | |
| RS47 | D3721 | D3722 | D3723 | D3724 | | D3735 | D3736 | D3737 | | D3747 | D3748 | D3749 | | D3755 | D3756 | D3757 | D3758 | D3759 | D3760 | 9 |
| | D3761 | D3762 | D3763 | D3764 | | D3775 | D3776 | D3777 | | D3787 | D3788 | D3789 | | D3795 | D3796 | D3797 | D3798 | D3799 | D3800 | 8 |
| RS48 | D3801 | D3802 | D3803 | D3804 | | D3815 | D3816 | D3817 | | D3827 | D3828 | D3829 | | D3835 | D3836 | D3837 | D3838 | D3839 | D3840 | 7 |
| | D3841 | D3842 | D3843 | D3844 | | D3855 | D3856 | D3857 | | D3867 | D3868 | D3869 | | D3875 | D3876 | D3877 | D3878 | D3879 | D3880 | 6 |
| RS49 | D3881 | D3882 | D3883 | D3884 | | D3895 | D3896 | D3897 | | D3907 | D3908 | D3909 | | D3915 | D3916 | D3917 | D3918 | D3919 | D3920 | 5 |
| | D3921 | D3922 | D3923 | D3924 | | D3935 | D3936 | D3937 | | D3947 | D3948 | D3949 | | D3955 | D3956 | D3957 | D3958 | D3959 | D3960 | 4 |
| RS50 | D3961 | D3962 | D3963 | D3964 | | D3975 | D3976 | D3977 | | D3987 | D3988 | D3989 | | D3995 | D3996 | D3997 | D3998 | D3999 | D4000 | 3 |
| | D4001 | D4002 | D4003 | D4004 | | D4015 | D4016 | D4017 | | D4027 | D4028 | D4029 | | D4035 | D4036 | D4037 | D4038 | D4039 | D4040 | 2 |
| RS51 | D4041 | D4042 | D4043 | D4044 | | D4055 | D4056 | D4057 | | D4067 | D4068 | D4069 | | D4075 | D4076 | D4077 | D4078 | D4079 | D4080 | 1 |
| | D4081 | D4082 | D4083 | D4084 | | D4095 | D4096 | SWF1 | | SWF11 | SWF12 | (FF) | | (FF) | (FF) | C1 | C2 | C3 | C4 | 0 |
| RS52 | E1.1 | E2.1 | E3.1 | E4.1 | | E15.1 | E16.1 | E17.1 | | E27.1 | E28.1 | E29.1 | | E35.1 | E36.1 | E37.1 | E38.1 | E39.1 | E40.1 | -1 |
| | E1.2 | E2.2 | E3.2 | E4.2 | | E15.2 | E16.2 | E17.2 | | E27.2 | E28.2 | E29.2 | | E35.2 | E36.2 | E37.2 | E38.2 | E39.2 | E40.2 | -2 |
| RS53 | E1.3 | E2.3 | E3.3 | E4.3 | | E15.3 | E16.3 | E17.3 | | E27.3 | E28.3 | E29.3 | | E35.3 | E36.3 | E37.3 | E38.3 | E39.3 | E40.3 | -3 |
| | E1.4 | E2.4 | E3.4 | E4.4 | | E15.4 | E16.4 | E17.4 | | E27.4 | E28.4 | E29.4 | | E35.4 | E36.4 | E37.4 | E38.4 | E39.4 | E40.4 | -4 |
| | E1.5 | E2.5 | E3.5 | E4.5 | | E15.5 | E16.5 | E17.5 | | E27.5 | E28.5 | E29.5 | | E35.5 | E36.5 | E37.5 | E38.5 | E39.5 | E40.5 | -5 |
| RS57 | E1.12 | E2.12 | E3.12 | E4.12 | | E15.12 | E16.12 | E17.12 | | E27.12 | E28.12 | E29.12 | | E35.12 | E36.12 | E37.12 | E38.12 | E39.12 | E40.12 | -12 |
| | E1.13 | E2.13 | E3.13 | E4.13 | | E15.13 | E16.13 | E17.13 | | E27.13 | E28.13 | E29.13 | | E35.13 | E36.13 | E37.13 | E38.13 | E39.13 | E40.13 | -13 |
| RS58 | E1.14 | E2.14 | E3.14 | E4.14 | | E15.14 | E16.14 | E17.14 | | E27.14 | E28.14 | E29.14 | | E35.14 | E36.14 | E37.14 | E38.14 | E39.14 | E40.14 | -14 |
| | E1.15 | E2.15 | E3.15 | E4.15 | | E15.15 | E16.15 | E17.15 | | E27.15 | E28.15 | E29.15 | | E35.15 | E36.15 | E37.15 | E38.15 | E39.15 | E40.15 | -15 |
| RS59 | E1.16 | E2.16 | E3.16 | E4.16 | | E15.16 | E16.16 | E17.16 | | E27.16 | E28.16 | E29.16 | | E35.16 | E36.16 | E37.16 | E38.16 | E39.16 | E40.16 | -16 |

103 ROWS

16 ROWS

D : DATA-BYTE
SWF : SECTOR WRITTEN FLAG-BYTE
C : CRC-BYTE
E : ERROR CORRECTION-CODE-BYTE
SB : SYNC BYTE
RS : RESYNC BYTE

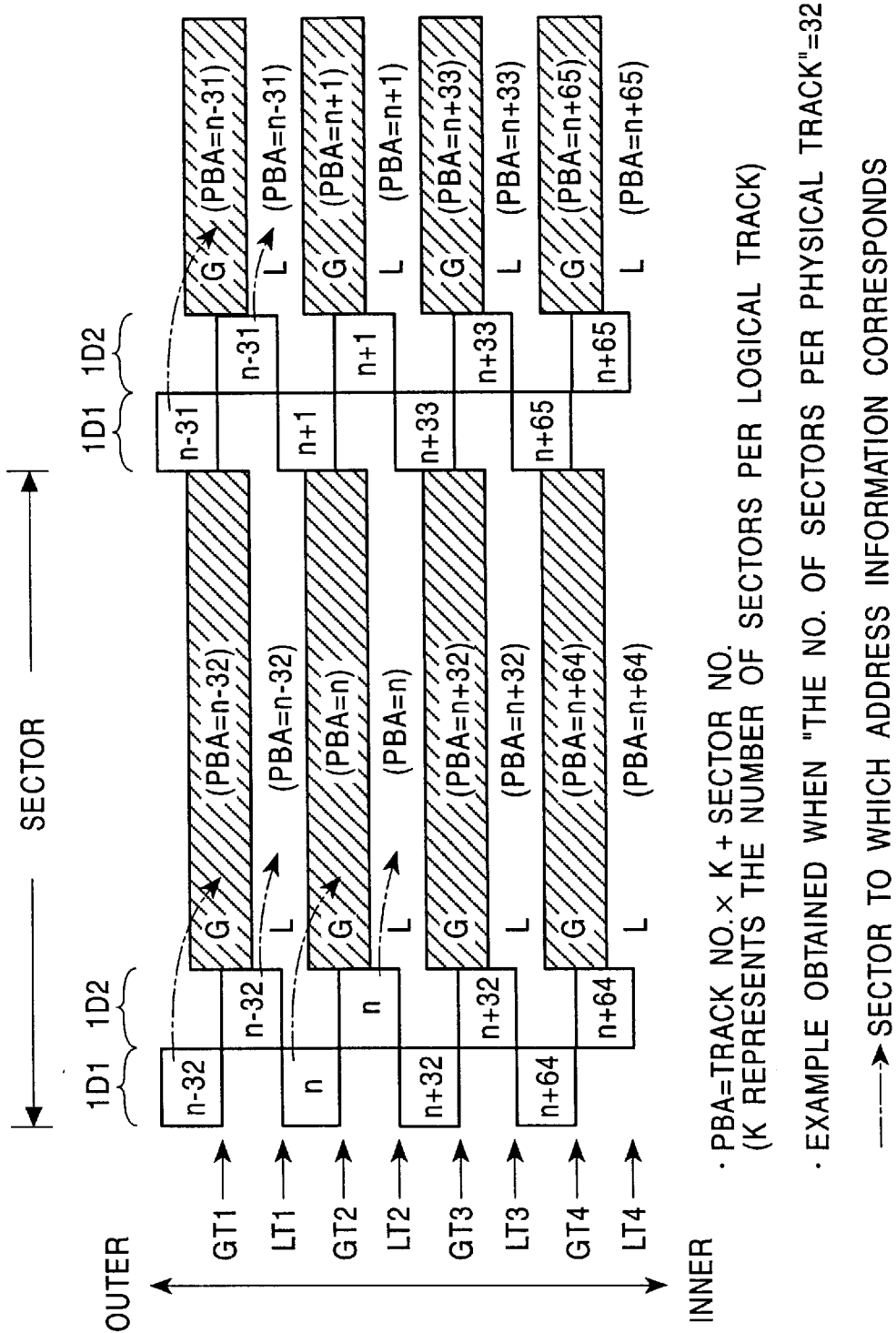

US 6,487,144 B2

DISK RECORDING MEDIUM INCLUDING DATA PRE-FORMATTED-DATA-RECORDED HEADER HAVING FIRST AND SECOND IDENTICAL ADDRESS NUMBERS RADIALLY DISPLACED FROM EACH OTHER ON OPPOSITE SIDES OF GROOVE OR LAND TRACK CENTER LINE, AND DISK DRIVE UNIT FOR USE WITH THE RECORDING MEDIUM

BACKGROUND OF THE INVENTION

1. Field of the Invention

The present invention relates to disk recording media such as magneto-optical disks, and disk drive units that perform writing or reading operations adapted for the media.

2. Description of the Related Art

Recently, an increase in the density of recording media has been required, and various technologies for high-density writing and reading have been developed.

For example, magneto-optical ("MO") disks have been used mainly for writing and reading computer data. As techniques for enabling high density recording on the magneto-optical disks, the magnetically induced super resolution (MSR) technique and the land/groove writing method have been developed.

In the land/groove writing method, both a land and a groove are used as recording tracks.

On a conventional magneto-optical disk, grooves are formed beforehand, and the grooves are used as recording tracks. By also using, as a recording track, the area or the land between one groove recording track and an adjacent groove recording track, the recording density of the disk can be greatly increased.

In the MSR technique, magnetic films having different temperature characteristics are used to read information recorded in a region smaller than the laser spot. Accordingly, from a medium (MSR medium) having recording regions composed of two magnetic films having different temperature characteristics, information written at a high density can be read without reducing the diameter of the laser spot.

The MSR reading method is described below with reference to FIG. 18.

The top portion (a) of FIG. 18 shows a recording track Dt of a magneto-optical disk on which write marks M are formed, and a laser spot SP impinging on the track Dt. The bottom portion (b) of FIG. 18 shows a partial cross section of the magneto-optical disk.

To obtain MSR effects, the magneto-optical disk must have, as shown in the bottom portion (b) of FIG. 18, a recording layer, an intermediate layer, and a reading layer that exhibit different magnetic characteristics depending on temperatures.

The reading layer functions as a mask for masking the write mark M from the laser spot SP when reading is performed.

The recording layer holds a written signal or information represented by the write mark M as a magnetization direction.

The intermediate layer controls the coupling between the reading layer and the recording layer.

By applying an external magnetic field to the reading layer when reading is performed, magnetization directions of the reading layer are aligned. This masks the recording layer (front masking). Here, by using the laser spot SP to heat the disk, in part of the laser spot SP which has an intermediate temperature of the heat distribution, the magnetized information on the recording layer, that is, the magnetization direction of the write mark M, is transferred to the reading layer. By observing the magnetization direction transferred to the reading layer, the write mark M, which is written at a high density, can be read, even if the laser spot SP has a large diameter.

In part of the laser spot SP which has a high temperature of the heat distribution, the reading layer and the recording layer are magnetically separated, and the reading layer functions to mask the recording layer from the external magnetic field (rear masking).

By using the above-described MSR technique, high-density writing and reading with a density at least double that of conventional techniques can be performed. This can greatly increase the recording capacity of the magneto-optical disk.

However, in achieving high density, the MSR technique and the land/groove writing method cause the following problems.

Although the MSR technique greatly increases the recording capacity of the magneto-optical disk, it cannot be applied to the entire surface of the magneto-optical disk.

For the magneto-optical disk, data units called "sectors" are employed as a basic data format, and data strings formed on the tracks of the disk consist of the sector units, which are sequential.

Each sector consists of a preformatted header (hereinafter also referred to simply as a "header") in which preformat data is written by embossed pits, and a write/read area (hereinafter referred to as an "MO area" for convenience of description) as a magneto-optical area in which data can be written or read, as shown in FIG. 19.

In the header, a sector address, etc., is written by embossed pits.

In the MO area, data including user data are written.

Accordingly, in the sectors of the magneto-optical disk, a recording film adapted for the MSR technique can be formed only in the MO area. The MSR technique cannot be applied to the header.

On the magneto-optical disk, at a predetermined position in an outer peripheral or inner portion, an area in which system information and write information are prewritten is preformatted. The MSR technique cannot be applied to this preformatted area.

In other words, in the preformatted area and the preformatted header of the sector, pre-recorded pits (hereinafter referred to as "prepits") must be formed at a conventional recording density because the MSR technique cannot be used.

As a result, the length of one byte is physically longer in the preformatted header than in the MO area. The area in the disk in which system information and write information are prewritten has greater redundancy.

In addition, a double-sided 5.2-gigabyte magneto-optical disk has a groove width of approximately 0.55 $\mu$m when employing the land/groove writing method. On a track formed on a groove G, a preformatted header is provided for the start of each sector, as shown in the top portion (a) of FIG. 20.

In this configuration, a land L between one track (groove G) and an adjacent track (groove G) acts as a shield against crosstalk from a preformatted header on the adjacent track.

In the header, address information that has a single value is written twice as ID1 and ID2.

Referring to the intermediate portion (b) of FIG. 20, when the land/groove writing method is also considered which has an identical pitch between groove tracks G and which uses a land L as a recording track in addition to the groove tracks G, the land L has a preformatted header similar to that on the adjacent groove tracks G, and has no shield for the header. Therefore, generated crosstalk makes it very difficult to read sector-address information written in the header on the land L. This causes deterioration in writing/reading performance or seeking performance.

In a general technique for avoiding the deterioration in performance, as shown in the bottom portion (c) of FIG. 20, the preformatted headers on the land track L and the groove track G are not radially arranged but either of tracks is arranged to be shifted backward by one length in the track direction. This can prevent the crosstalk from affecting address information to be read.

However, this case causes large redundancy since the start of each sector must have an area which is double the header area.

When the redundancy caused by the preformatted header in the employment of the MSR technique, and the redundancy caused by crosstalk avoidance in the land/groove writing method are taken into consideration, at least 5 percent of the total recording capacity is wasted. In other words, simply employing the MSR technique and the land/groove writing method cannot achieve an effective increase in the recording capacity.

Accordingly, for enabling a large recording capacity, the redundancy caused by the preformatted header in the employment of the MSR technique, and the redundancy caused by crosstalk avoidance in the land/groove writing method must be reduced.

SUMMARY OF THE INVENTION

Accordingly, it is an object of the present invention to provide a disk recording medium the recording density of which is increased by an effective data arrangement in the header of each sector, using the MSR technique or the land/groove method, and a disk drive unit therefor.

To this end, according to an aspect of the present invention, the foregoing object is achieved through provision of a disk recording medium having recording tracks in the form of groove tracks and land tracks which each have sectors as data units. In the disk recording medium, each of the sectors includes a preformatted-data-recorded header area and a writing/reading area in which data is written or read, and the header area includes at least both a first address and a second address which have identical address numbers, and the first address and the second address are positioned to be reversely displaced from the center line of one groove track or one land track to the radial direction of the disk recording medium.

Preferably, one of the first address and the second address corresponds to a sector on one groove track, and the other one of the first address and the second address corresponds to a sector on one land track.

In the writing/reading area, a recording film for use in reading by the magnetically induced super resolution technique may be formed.

A plurality of zones may be radially formed on the disk recording medium, and only either of the first address and the second address may be positioned in a boundary area between adjacent zones.

In at least one zone, logically different addresses may be assigned to the groove tracks and the land tracks.

According to another aspect of the present invention, the foregoing object is achieved through provision of a disk drive unit for a disk recording medium which has recording tracks in the form of groove tracks and land tracks each having sectors as data units, and in which the sectors each include a preformatted-data-recorded header area and a writing/reading area in which data is written or read, and the header area includes at least both a first address and a second address which have identical address values, and the first address and the second address are positioned to be reversely displaced from the center line of one groove track or one land track to the radial direction of the disk recording medium. The disk drive unit includes a head unit for writing/reading information to/from the groove tracks and the land tracks, and a control unit for controlling the head unit to perform a writing operation or a reading operation based on a sector address on the groove track or a sector address on the land track which is determined using the address values read at the first address and the second address by the head unit.

Preferably, the disk drive unit further includes a servo unit for switching scanning modes of writing or reading by the head unit, which correspond to the scanning of the groove tracks and the scanning of the land tracks. The control unit determines, based on the scanning mode switched by the servo unit and the two address values at the first address and the second address, the sector address on the groove track or the sector address on the land track.

Preferably, the two address values are identical for one of the groove track and the land track, and have a predetermined differential value for the other one of the groove track and the land track.

The disk recording medium may have a plurality of zones that are radially formed, and when the head unit scans either the groove track or the land track, the control unit may specify one zone based on the difference between the two address values read at the first address and the second address.

BRIEF DESCRIPTION OF THE DRAWINGS

FIG. 1 is an illustration of the zone structure of a disk according to an embodiment of the present invention;

FIG. 2 is an illustration of a zone arrangement of the disk according to the embodiment;

FIG. 3 is an illustration of the number of sectors in each zone on the disk according to the embodiment;

FIG. 6 is an illustration of a data field in a sector on the disk according to the embodiment;

FIG. 7 is an illustration of an arrangement of address information written on the disk according to the embodiment;

DESCRIPTION OF THE PREFERRED EMBODIMENTS

Figure 4:
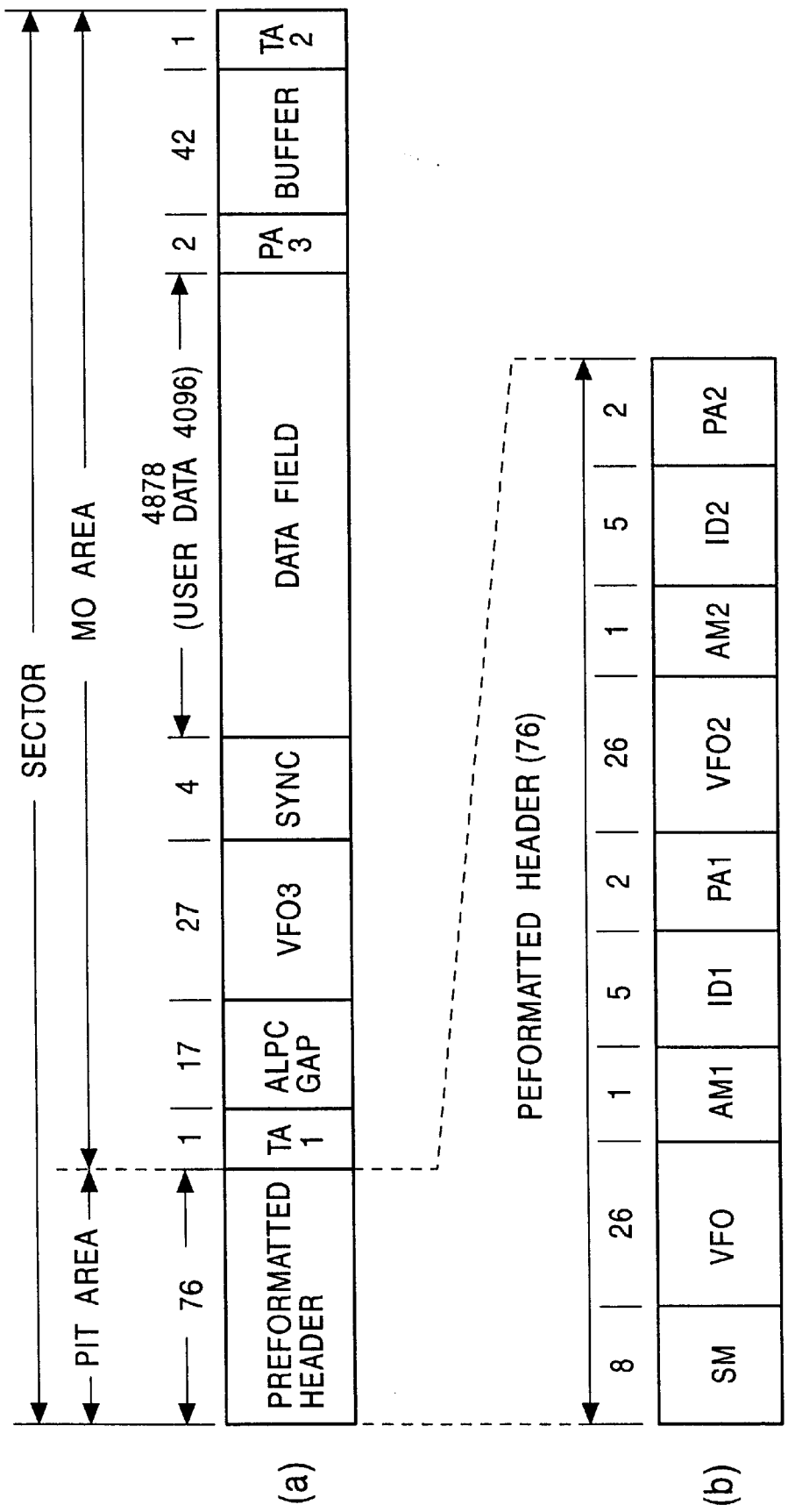
FIG. 4 is an illustration of the sector structure on the disk according to the embodiment.

With reference to the accompanying drawings, a disk recording medium and a disk drive unit adapted for the medium according to embodiments of the present invention are described below in the following order:

1. Zone Structure in Disk;
2. Sector Structure;
3. Header Arrangement and Address Reading Method;
4. Construction of Disk Drive Unit; and
5. Writing/Reading Operation.

1. Zone Structure in Disk

A magneto-optical disk according to an embodiment of the present invention is radially divided into a plurality of zones. The zone structure is shown in FIG. 1.

Although data modulation, error-correcting encoding, and sector size have great relevance when redundancy is considered, the magneto-optical disk, whose zone structure and sector structure are described below, is based on the assumption that the (1,7) RLL modulation method, 16-byte vertical parity, and a sector format using a 4-kilobyte sector are employed.

The central portion of the disk is used as a so-called "clamping area" and a so-called "clearance area". For an area from a circumference around the clearance area to the outermost circumference, that is, an area from a radius of 27.00 mm to a radius of 62.5 mm, a zone format is defined as shown in FIG. 1.

The zone format consists of, from the outer circumferential side, a "Lead-in Zone", an "Outer Control Track SFP Zone", an "Outer Manufacturer Zone", a "User Zone", an "Inner Manufacturer Zone", an "Inner Control Track SFP Zone", a "Transition Zone for SFP", a "PEP Zone", and a "Reflective Zone".

In the User Zone, the reading and writing of various data as main data is performed by a user.

The User Zone is divided into 18 zones, namely, zones #0 to #17. In the User Zone, the so-called "zone CAV Method" is employed in which the difference between the recording density in an inner portion of the disk and the recording density in an outer portion of the disk is minimized by performing writing and reading with a different clock signal for each zone.

The Outer Control Track SFP Zone and the Inner Control Track SFP Zone are preformatted areas in which system information and write information are prewritten.

The Outer Manufacturer Zone and the Inner Manufacturer Zone each include a guard band, a test zone for manufacturer use, and a test zone for driving.

The PEP Zone is formed so that only the reading of information is allowed when there is no limitation in tracking. For example, by forming pit marks arranged radially, a reflective pattern having a bar-code shape is circumferentially formed. In the PEP Zone, disk information as PEP data is written, which is management information.

The range of radial positions of the above zones, and logical track numbers and the number of tracks of each zone are shown in FIG. 2.

The following description is based on the assumption that this embodiment has a track pitch of 0.68 $\mu$m/bit and 4096 bytes/sector. Obviously, the present invention is not limited to this embodiment.

Logical track numbers "0" to "93059" are assigned to 93060 tracks in the User Zone. On the outer circumferential side from the User Zone, "−1" to "−1568" are assigned. On the inner circumferential side from the User Zone, "93060" to "93585" are assigned.

In this embodiment, one logical track is a range of six sectors, and differs from a physical track (one circumferential track) on the disk.

Logical tracks and logical block addresses (LBAs) (described below) are addresses treated by a host unit in the process of writing and reading, while physical tracks and PBAs (PBAs) are values that are physically assigned on the disk.

The logical addresses correspond to the physical addresses in principle. However, the logical addresses have some offsets against the physical addresses. The reason that the logical addresses have some offsets is that the logical addresses are not assigned to areas such as a defective area, an alternate area therefor, and a buffer area at a zone boundary, so that these areas are not accessed.

FIG. 3 shows the numbers of tracks and the numbers of sectors in the eighteen zones #0 to #17 in the User Zone.

Figure 8:
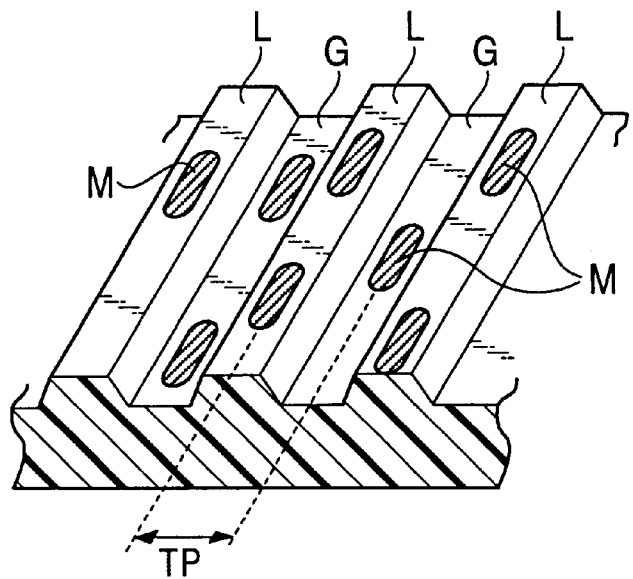
FIG. 8 is an illustration of the land/groove writing method employed on the disk according to the embodiment.

Since this embodiment employs the land/groove writing method, write marks M are formed by using not only grooves G on the disk but also lands L as write tracks, as schematically shown in FIG. 8.

Accordingly, in the zones #0 to #17 in FIG. 3, values relating to the grooves G and values relating to the lands L are separately shown.

The zones #0 to #17 each have 2640 physical tracks. In other words, a range of 2640 physical tracks is treated as one zone. The value 2640 is the sum of the numbers of groove tracks and land tracks.

A position at which each zone is provided on the disk is represented by the inner radial position of the zone.

Since the zone CAV Method is employed as described above, the number of sectors formed in one physical track differs depending on each zone, as shown in FIG. 3. For example, zone #0 has 32 sectors, zone #1 has 31 sectors, and zone #17 has 15 sectors.

The total number of sectors in each zone is obtained by multiplying the number of physical tracks and the number of sectors in one physical track, as shown in the last column in FIG. 3.

For example, zone #0 has 84480 sectors.

Thus, the total number of groove-track sectors is 84480/2=42240. Similarly, the total number of land-track sectors is 42240.

Because 6 sectors=1 logical track as described above, zone #0 has 7040 logical tracks in each group of groove tracks and land tracks.

Logical track numbers "0" to "93060" are assigned to the User Zone, as shown in FIG. 2. Specifically, as can be clear from the logical track start values shown in FIG. 3, as logical track numbers assigned to the groove tracks and logical track numbers assigned to land tracks, zone #0 has "0" to "7039", zone #1 has "7040" to "13859", and zone #17 has "89760" to "93060".

2. Sector Structure

Figure 5:
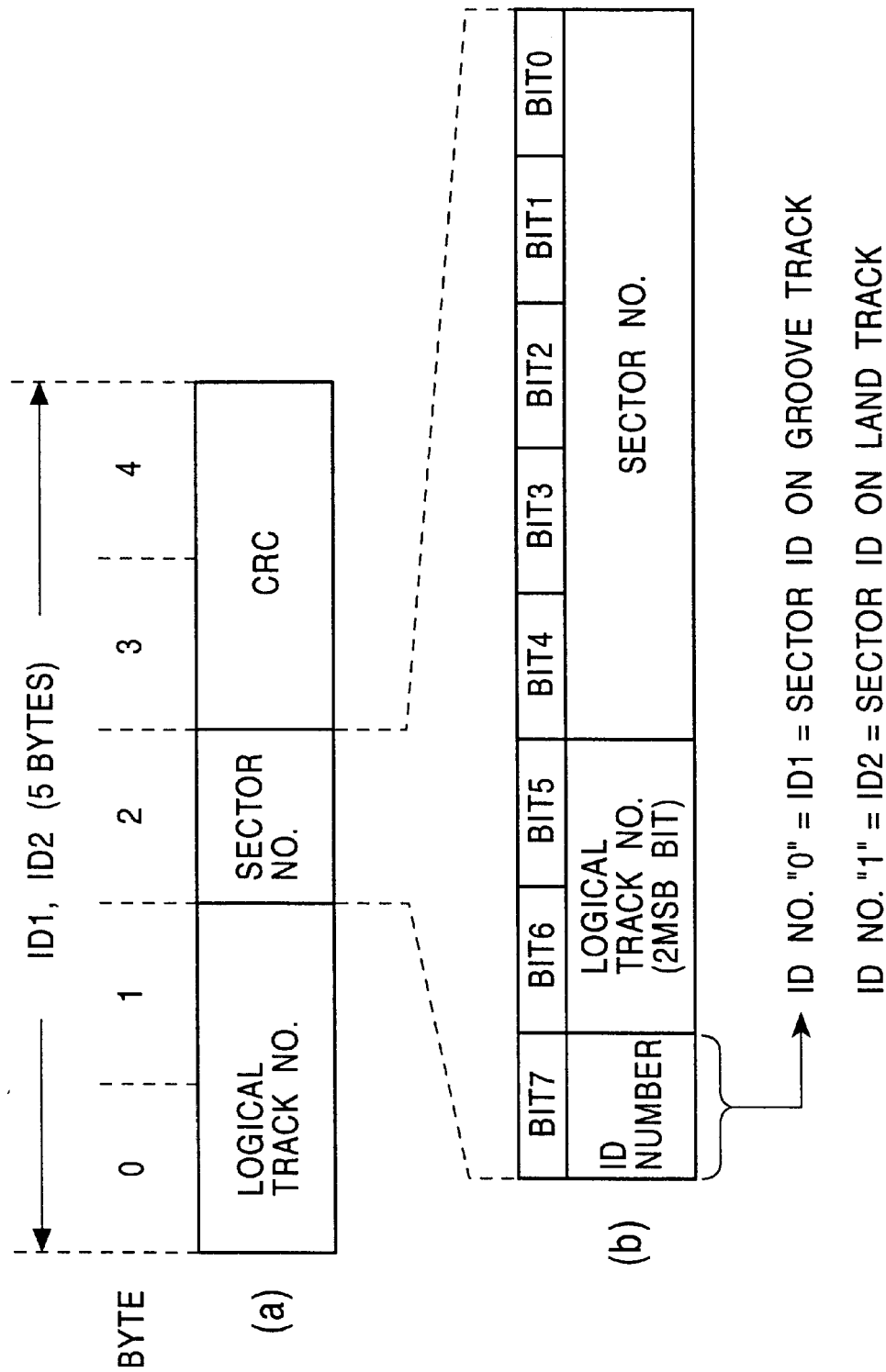
FIG. 5 is an illustration of the sector structure on the disk according to the embodiment.

With reference to FIGS. 4 to 6, the sector format on the disk is described below.

On the magneto-optical disk, user data are written in writing/reading units.

Figure 19:
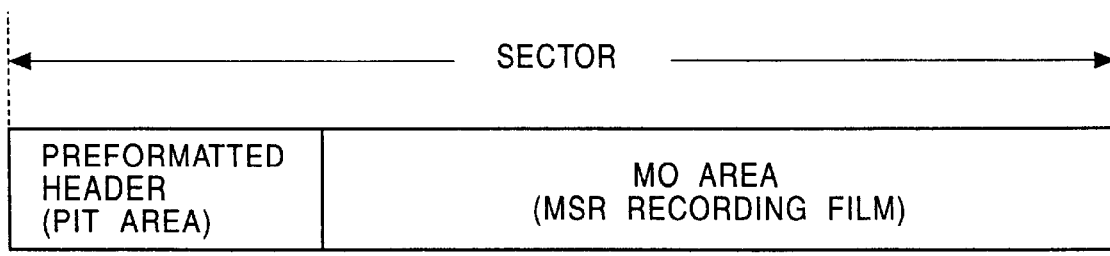
FIG. 19 is an illustration of a sector structure.

Each sector consists of a preformatted header and an MO area, as shown in FIG. 19.

Figure 18:
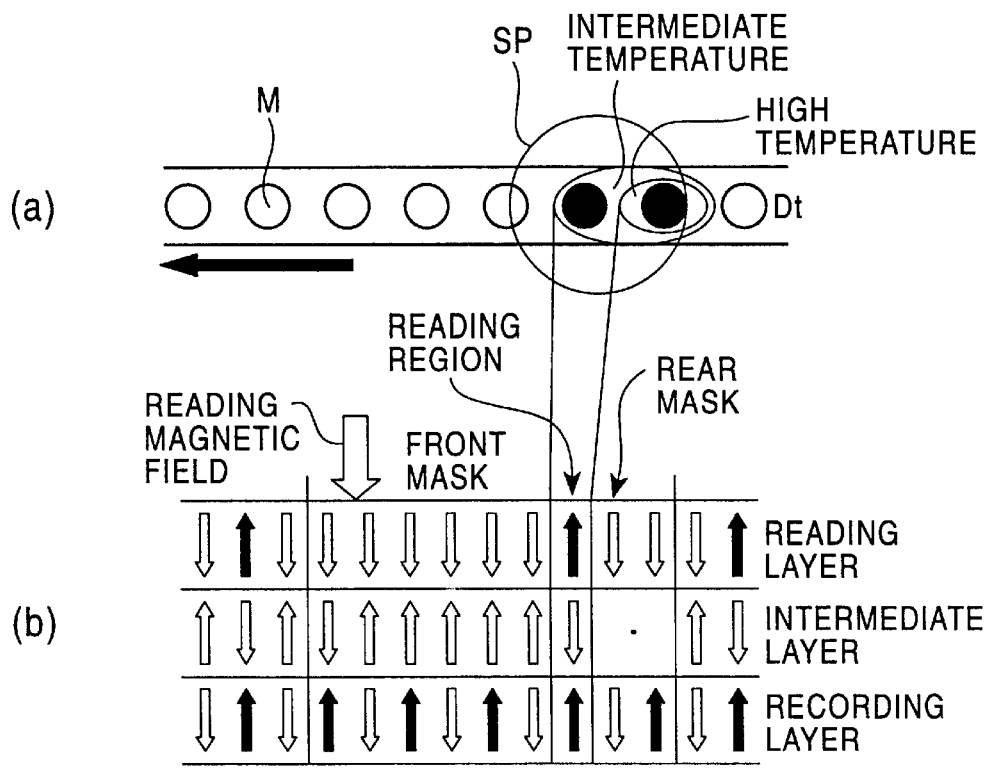
FIG. 18 is an illustration of a reading operation by the MSR technique.

The header is a read-only area (pit area) in which preformat data are written by so-called "embossed pits". As shown in the top portion (a) of FIG. 4, excluding the header, areas from a transition area TA1 to a transition area TA2 are used as an MO area. In this MO area, the MSR effects described using FIG. 18 can be obtained.

The top portion (a) of FIG. 4 shows the number of bytes in each area. One sector is divided into the header, which has 76 bytes, the transition area TA1, which has 1 byte, a 17-byte ALPC gap, a 27-byte VFO3, 4-byte "Sync", a 4878-byte data field, a 2-byte postamble PA3, a 42-byte buffer, and the transition area TA2, which has 1 byte.

The bottom portion of FIG. 4 shows the 76-byte header in an enlarged form.

The header consists of a 8-byte sector mark SM, a 26-byte "VFO1", a 1-byte address mark AM1, a 5-byte address ID1, a 1-byte postamble PA, a 26-byte "VFO2", a 1-byte address mark AM2, a 5-byte address ID2, and a 1-byte postamble PA2 in the order given.

The sector mark SM is used to recognize the start of the sector, and is formed by embossing a pattern that is not generated by the (1,7) RLL modulation method.

VFO fields in one sector are used to synchronize a variable frequency oscillator in a PLL unit of a disk drive unit (described below), and consist of "VFO1", "VFO2", and "VFO3". The VFO fields are used for PLL.

In the address part of the header, the VFO1 and the VFO2 are formed by embossing.

The VFO3 is formed in the MO area or the data part of the sector, as shown in the bottom portion (b) of FIG. 4. When writing to the sector is performed, the VFO3 is magnetooptically written.

In the VFO1 and the VFO2, predetermined-pattern signals for PLL (the generation of a read clock signal) are written which are intended to read data (address) in the header.

In the VFO3, a predetermined-pattern signal for PLL (the generation of a read clock signal) is written which is intended to read data written in the MO area. For example, the VFO3 contains a pattern (2T pattern) in which channel bits "0" and "1" alternately appear. Accordingly, when a time corresponding to the time length of one channel bit is represented by T, a read signal is obtained the level of which is inverted every 2T when the VFO fields are read.

The address marks AM1 and AM2 are used to establish byte synchronization for the subsequent address ID1 and address ID2.

The address ID1 and address ID2 each have a sector address, namely, information on a track number and a sector number, and a cyclic redundancy check (CRC) field for detecting an error in the information.

The address ID1 and address ID2 contain the sector addresses, which are identical. In other words, in one sector, an address is written twice.

The postambles PA1 and PA2 in the header, and the postamble in the MO area each have a predetermined pattern.

The structure of each of the address ID1 and the address ID2 is shown in FIG. 5.

As shown in the top portion (a) of FIG. 5, a 2-byte logical track number, a 1-byte sector number, and a 2-byte CRC field are assigned to each of the address ID1 and the address ID2.

The eight bits of a byte representing a sector number are assigned as shown in the bottom portion of (b) FIG. 5. Bit 7 represents an ID number, bits 6 and 5 represent a logical track number, and bits 4 to 10 represent a sector number.

Since this embodiment employs the land/groove writing method, pits that corresponding to the address ID1 and the address ID2 are formed on the track at radially displaced positions from the center of one groove.

Basically, the address ID1 and the address ID2 contain identical values. The address ID1 is used as a groove-track address, and the address ID2 is used as a land-track address.

Accordingly, bit 7 defines the ID number, and the address ID1 represents an address corresponding to a groove track when the ID number="0". The address ID2 represents an address corresponding to a land track when the ID number= "1".

The employment of the land/groove writing method approximately doubles the number of tracks, so the two bytes shown in the top portion (a) of FIG. 5 are insufficient to described the logical track number. Accordingly, the two bits of bits 6 and 5 are assigned to the logical track number, as shown in the bottom portion (b) of FIG. 5, and the most significant two bits of the logical track number are described. In other words, the logical track number can be described using 18 bits.

Bits 4 to 0 are used to describe the sector number. At this time, the address ID1 and the address ID2 contain identical values. However, by using the ID number to describe the track type among the groove track and the land track, a sector designated by the sector number is physically another sector. In other words, the sector of the groove track formed subsequently to the address ID1 and the address ID2, and the sector number of the sector on the land track are represented by the same value.

In the address ID1 and the address ID2, the sector numbers are identical but the ID numbers differ. Thus, the CRC value shown in the top portion (a) of FIG. 5 differs depending on each of address ID1 and the address ID2.

In the top portion (a) of FIG. 4, after the header, the ALPC gap area, which is subsequent to the transition area TA1, is provided for reserving a time required for a disk drive unit after it completes the reading of the header, for allowing a shift in the position of the subsequent VFO3, and for testing laser power in writing mode.

The Sync (4 bytes) is provided so that the disk drive unit obtains byte synchronization for the subsequent data field, and has a predetermined bit pattern.

The data field is provided for recording user data. A size of 4096 bytes is prepared for the user data. In addition, since bytes for error correction, a correcting parity, etc., are added to the size, the total size is 4878 bytes.

The data field contains a resynchronization pattern at a predetermined position.

The buffer field is used as a tolerance for an electric or mechanical error.

The contents of the Sync and data field (shown in the top portion (a) of FIG. 4) are shown in FIG. 6.

In FIG. 6, excluding synchronization bytes SB1 to SB4 that constitute the 4-byte Sync, 4760 bytes composed of 119 rows×40 columns and the 118 bytes of resynchronization bytes (RS1, RS1) to (RS59, RS59) form 4878 bytes for the data field.

One row, namely, 40 bytes, are used as an interleave length.

As shown in FIG. 6, in the data field, the 4096-byte user data are written as data bytes D1 to D4096 in 103 rows from the 1st row to the 103rd row. Subsequently to the data bytes, a 12-byte sector written flag (SWF1 to SWF12) and a 4-byte CRC (C1 to C4) are written.

In addition, in 16 rows from the 104th row to the 119th row, 640-byte error-correcting codes (E1, 1) to (E40, 16) are written.

3. Header Arrangement and Address Reading Method

The arrangement of the address ID1 and the address ID2 in the header and an address reading method for the groove tracks and the land tracks, in the disk according to the embodiment which has the above-described zoning and sector format, are described below.

The disk according to the embodiment is characterized in that the first address and the second address that are identical address numbers in the header of the sector, namely, pits that correspond to the address ID1 and the address ID2 are formed radially from the center line of one groove track or one land track so as to be displaced in reverse directions.

A specific example is schematically shown in FIG. 7. Addresses ID1 and addresses ID2 in the header are disposed so as to be shifted with respect to groove tracks GT1, GT2, etc., and land tracks LT1, LT2, etc.

By way of example, when address ID1 and address ID2 are considered which have the value "n" as identical PBAs, the address ID1 is disposed at positions displaced by 90 degrees from the center line of the groove track GT2 to the outer circumferential side of the disk. The address ID2 is positioned to be displaced by 90 degrees from the center line of the groove track GT2 to the inner circumferential side of the disk.

The example shown in FIG. 7 is based on the assumption that zone #1 shown in FIG. 3 is used. In this case, one physical track has 32 sectors. Thus, address ID1 and address ID2, next to the address ID1 and the address ID2 that each contain the value "n" on the inner circumferential side of the disk, are each represented by a PBA of "n+32". Also, the address ID1 that contains "n+32" is positioned to be displaced by 90 degrees to the outer circumferential side of the disk, and the address ID2 that contains "n+32" is positioned to be displaced by 90 degrees to the inner circumferential side of the disk.

The "90 degrees" is obtained when the pitch between a groove track and the next groove track is set to 360 degrees.

A PBA is calculated by "track number"×K+"sector number" where K represents the number of sectors in one logical track (K=6 in this example).

Figure 9:
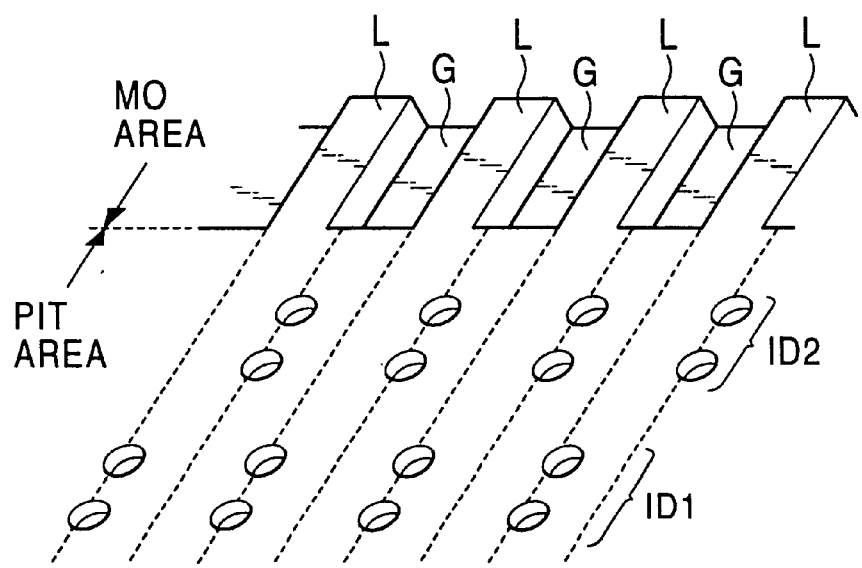
FIG. 9 is an illustration of an arrangement of addresses on the disk according to the embodiment.

FIG. 9 schematically shows pits corresponding to the address ID1 and the address ID2 that are displaced as described above.

As can be clear from FIG. 9, the pits corresponding to the address ID1 and the address ID2 are formed to be displaced by 90 degrees in reverse directions from the center line of the groove track G.

FIGS. 7, 9, and other figures for use in the following description slightly differ from the actual disk surface since they are schematic drawings mainly for the purpose of representing the positions of the address ID1 and the address ID2. Although the header includes prepits that correspond to the sector mark SM, the VFOs, and the address marks, excluding the address ID1 and the address ID2, the representations thereof are omitted in each figure for avoiding complication.

As shown in FIG. 7, the address ID1 and the address ID2 that are identical designate a sector on each groove track and a sector on each land track, respectively, as denoted by each chain line.

Figure 10:
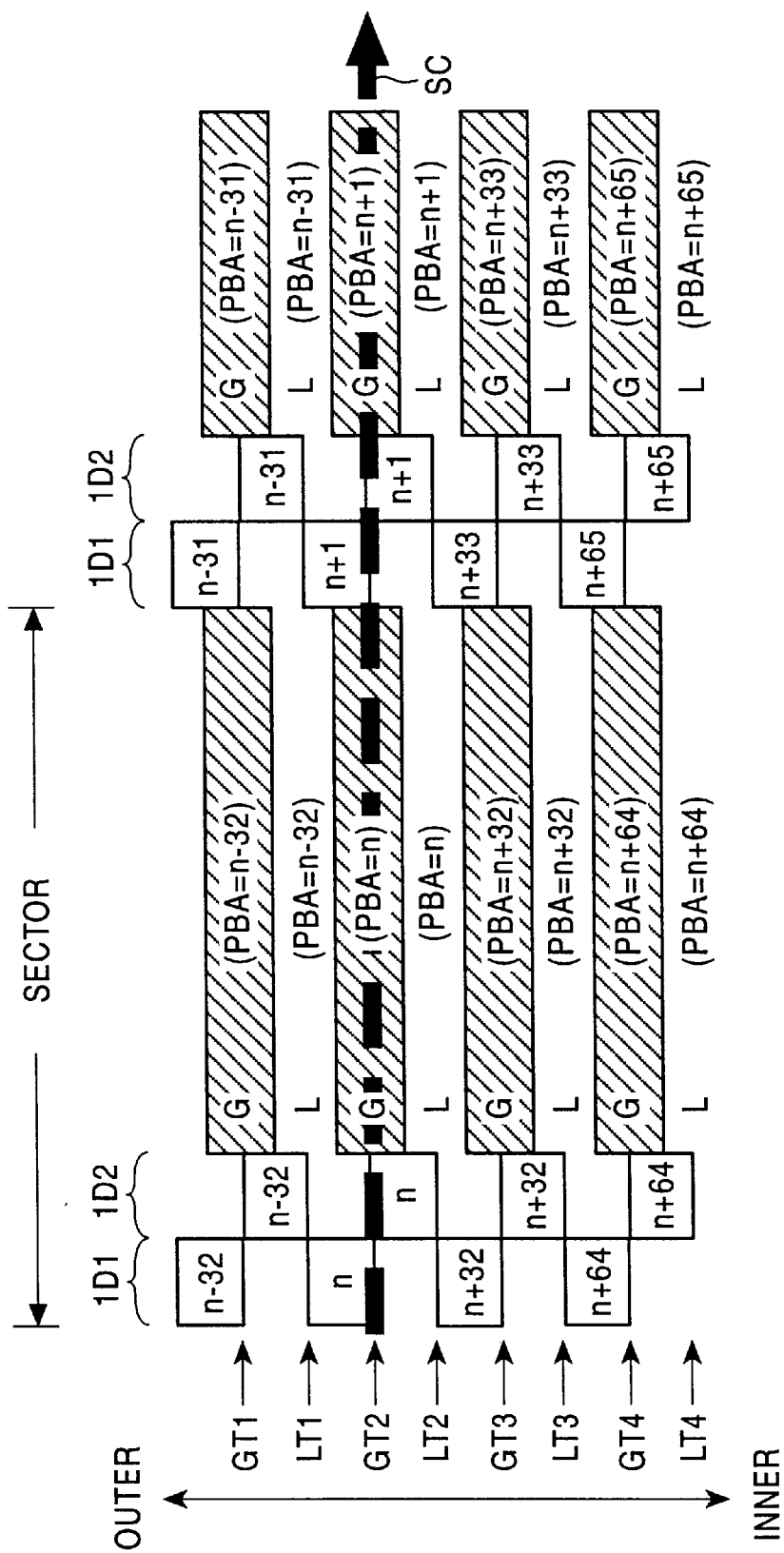
FIG. 10 is an illustration of an address reading operation to the disk according to the embodiment.

A case is considered in which the disk drive unit scans the above-described disk for writing or reading. When the disk drive unit scans a groove track while performing tracking servo-control, the scanning path is indicated by the broken line shown in FIG. 10.

For example, when the groove track GT2 is scanned, the value "n" as address ID1, and the value "n" as address ID2 are read from the header of the sector in which PBA=n. In the next sector, the value "n+1" as address ID1 and the value "n+1" as address ID2 are read.

Figure 11:
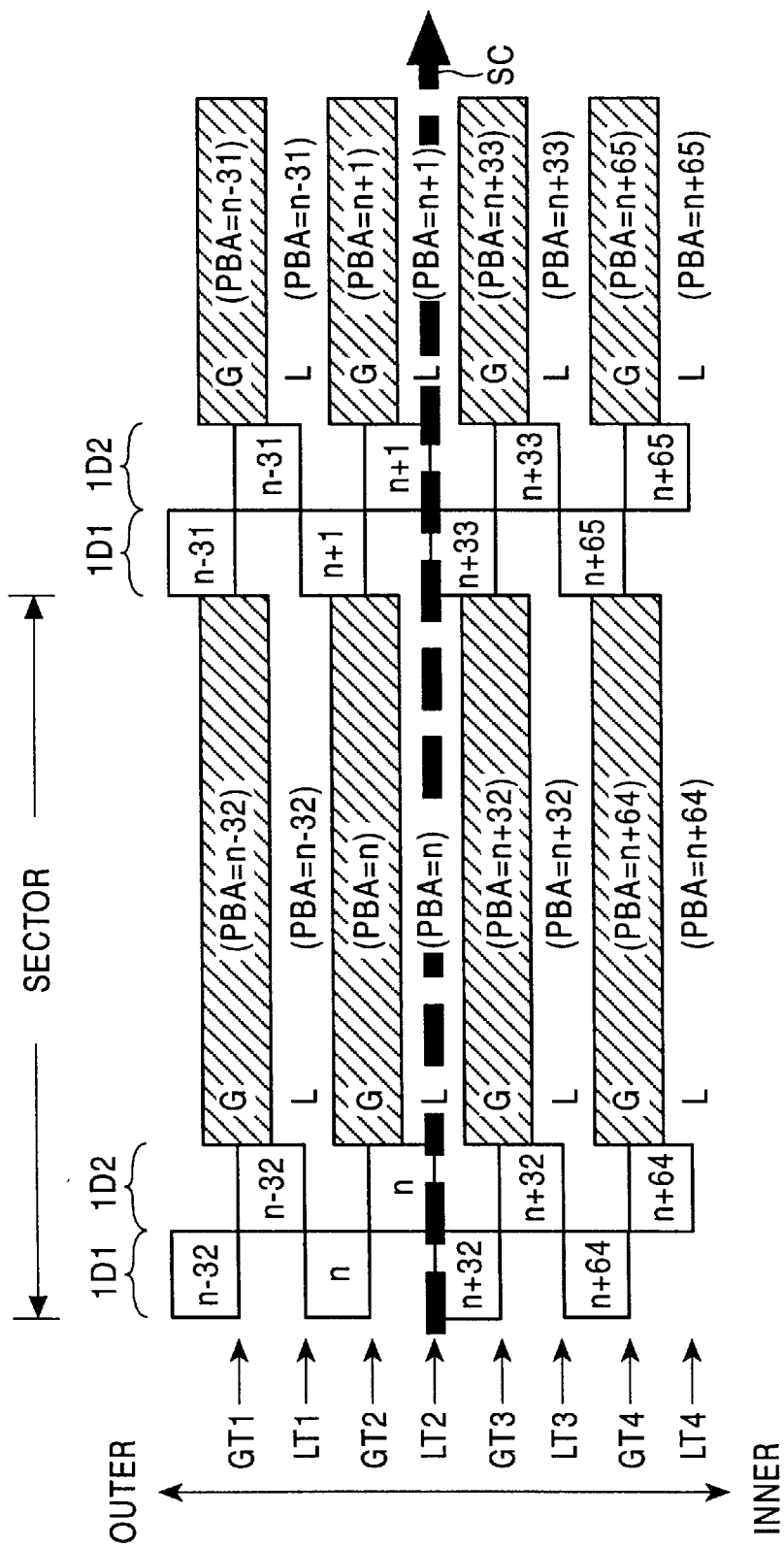
FIG. 11 is an illustration of an address reading operation to the disk according to the embodiment.

When the disk drive unit scans a land track while performing tracking servo-control, the path of the scanning is indicated by the broken line shown in FIG. 11.

For example, when the land track LT2 is scanned, the value "n+32" as address ID1 and the value "n" as address ID2 are read from the header of the sector in which PBA=n. In the next sector, the value "n+33" as address ID1 and the value "n+1" as address ID2 are read.

As described above, in the land track scanning mode, a value as the address ID1 and a value as the address ID2 differ.

The disk drive unit inverts the polarity of a tracking-error signal for tracking servo-control between the groove track scanning mode and the land track scanning mode. This means that the controller of the disk drive unit can determine either the groove track scanning mode or the land track scanning mode, based on the set polarity of the tracking-error signal for tracking servo-control.

Figure 12:
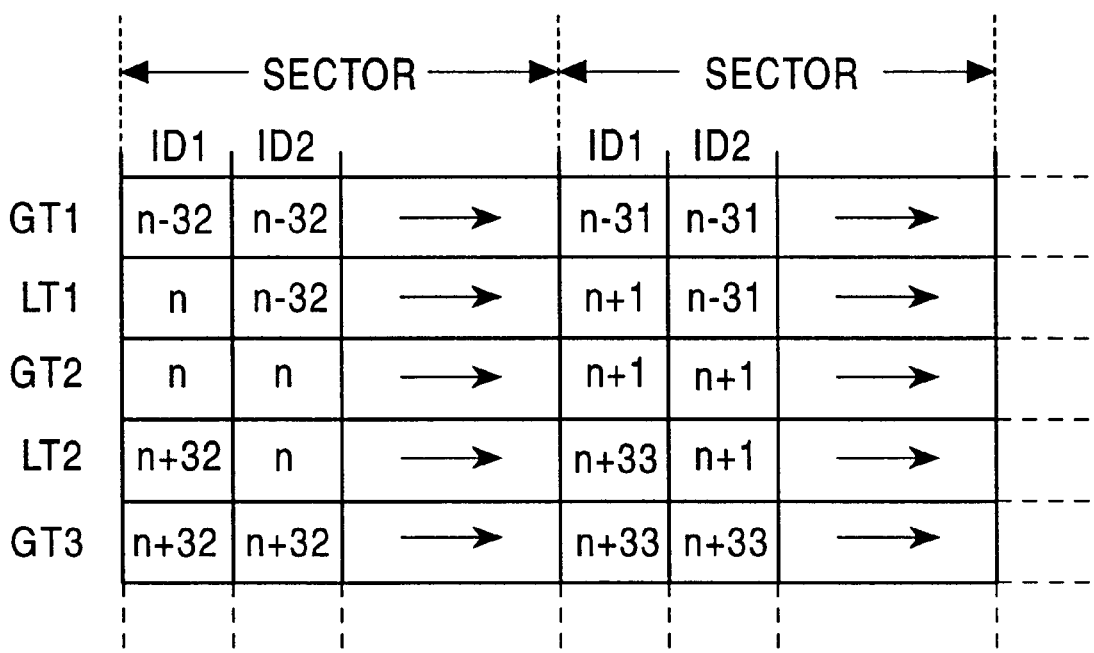
FIG. 12 is an illustration of read addresses obtained when the disk according to the embodiment is operated.

FIG. 12 shows the values of the address ID1 and the address ID2 which are obtained when each of the groove tracks GT1, GT2, and GT3, and the land tracks LT1 and LT2 is scanned.

As can be seen from FIG. 12, when a laser spot scans each groove track, the address ID1 and the address ID2 have identical values. When the laser spot scans each land track, the values of the address ID1 and the address ID2 have a predetermined difference.

This difference corresponds to the number of sectors per physical track (32 in zone #0).

Accordingly, when the disk drive unit is in the land track scanning mode, an expected value of the actual sector address is a PBA obtained from the address ID2. An expected value of the address ID1 is obtained by the expression, (the PBA of the address ID2)+(the number of sectors per physical track).

In other words, the actual sector address can be obtained by subtracting the number of sectors per physical track from the value of the address ID1.

The above-described formation of the address ID1 and the address ID2 provides the following advantages.

By using the address ID1 and the address ID2, each of the groove-track address value and the land-track address value can be obtained twice. Thus, reliability of address reading can be maintained equivalently to the conventional disk (e.g., the example in FIG. 20, portions (a) and (b)).

Specifically, from the groove tracks, the address value can be obtained twice as the address ID1 and the address ID2. Concerning the land tracks, by subtracting the number of sectors per track from the PBA value obtained from the address ID1, the actual address value can be obtained, and the same value can be obtained from the address ID2. Accordingly, the groove tracks and the land tracks each have two substantial addresses for one sector.

In each sector, from among two addresses, at least one address may be read. On each groove track, the sector address can be specified by reading either the address ID1 or the address ID2. On each land track, by reading the address ID2, the sector address can be directly specified. Also, when only the address ID1 is read, the sector address can be obtained by subtracting the number of sectors per physical tracks from the PBA of the address ID1.

The reliability of address reading is maintained by performing substantially double writing of the address, and the land/groove writing method is employed, whereby both address ID1 and address ID2 obtain a sufficient pitch with respect to radially adjacent address ID1 and address ID2. Therefore, the leaking of the signal from an adjacent track as in the case described with the intermediate portion (b) of FIG. 20 can be suppressed to a substantially sufficient level.

Figure 20:
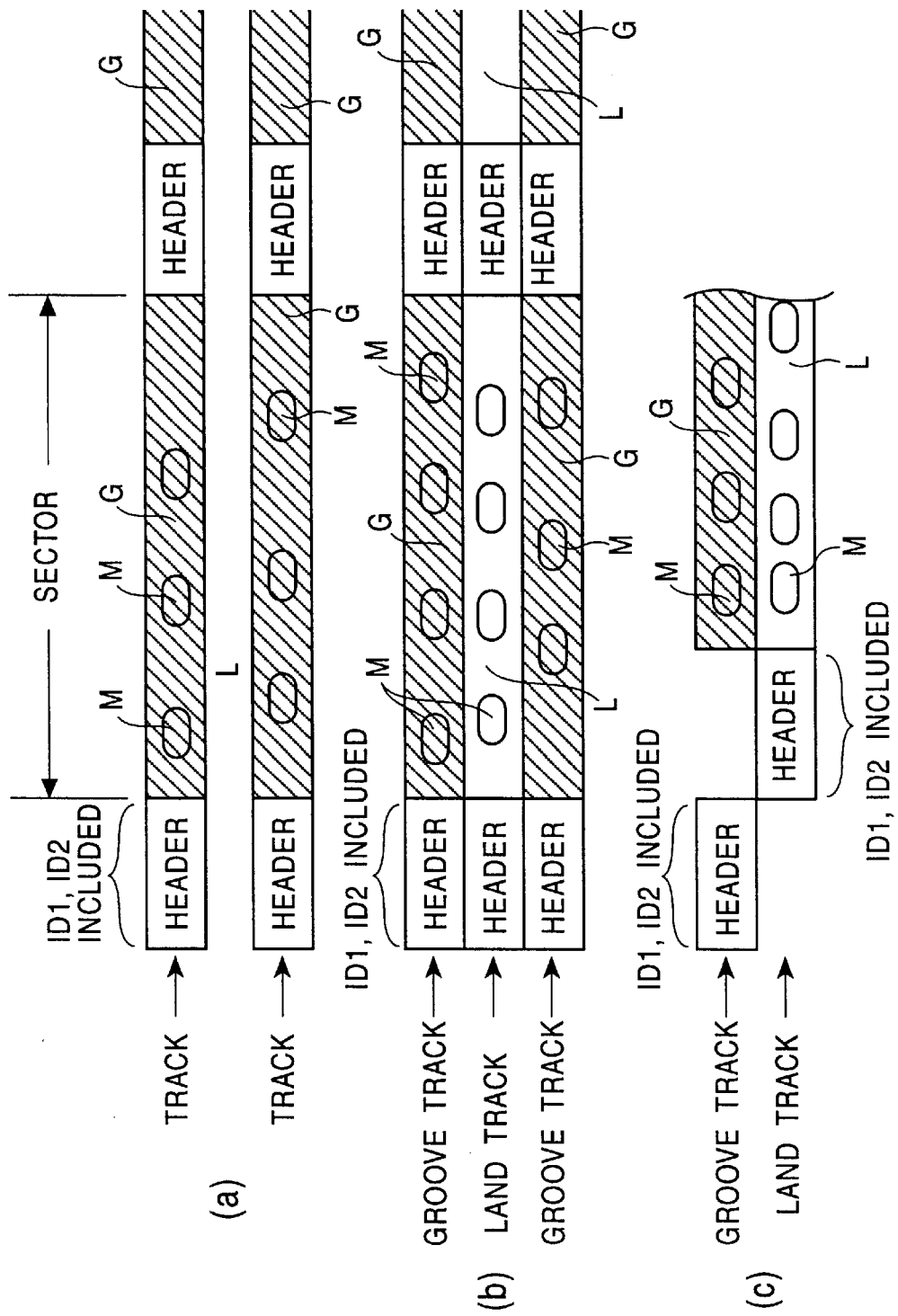
FIG. 20 is an illustration of redundancy generated in the land/groove writing method.

Moreover, to obtain the above effects, the physical length of the preformatted header does not need to be increased. In other words, the need for using the header arrangement as shown in the bottom portion (c) of FIG. 20 is eliminated. Accordingly, the redundancy of the header can be minimized.

The above-described generation in the land track scanning mode of a difference between the values of the address ID1 and the address ID2 which is the number of sectors per physical track also provides an advantage in that the difference can uniquely specify the zone that is being scanned.

As described with reference to FIG. 3, zones #0 to #17 each have a different number of sectors per physical track.

Thus, when a difference between the values of the address ID1 and the address ID2 is 32 sectors, it is found that a track in zone #0 is being scanned. When the difference is 33 sectors, it is found that a track in zone #1 is being scanned.

This is a very useful technique that can easily specify a zone that is being operated when the disk drive unit is in seek mode or still mode.

According to the disk in this embodiment, the arrangement of the address ID1 and the address ID2 provides various advantages, which minimize the redundancy of the header in the land/groove writing method, and the use of the MSR technique enables efficient high density.

In the above-described embodiment, the address ID1 and the address ID2 that have identical values are positioned by 90 degrees from the center line of one groove track to the outer and inner circumferential sides. However, the address ID1 and the address ID2 that have identical values may be displaced by 90 degrees to the outer and inner circumferential sides from the center line of a land track. In this case, in the land track scanning mode, the address ID1 and the address ID2 are detected as identical values, and in the groove track scanning mode, the address ID1 and the address ID2 have a difference corresponding to the number of sectors per physical track.

Figure 13:
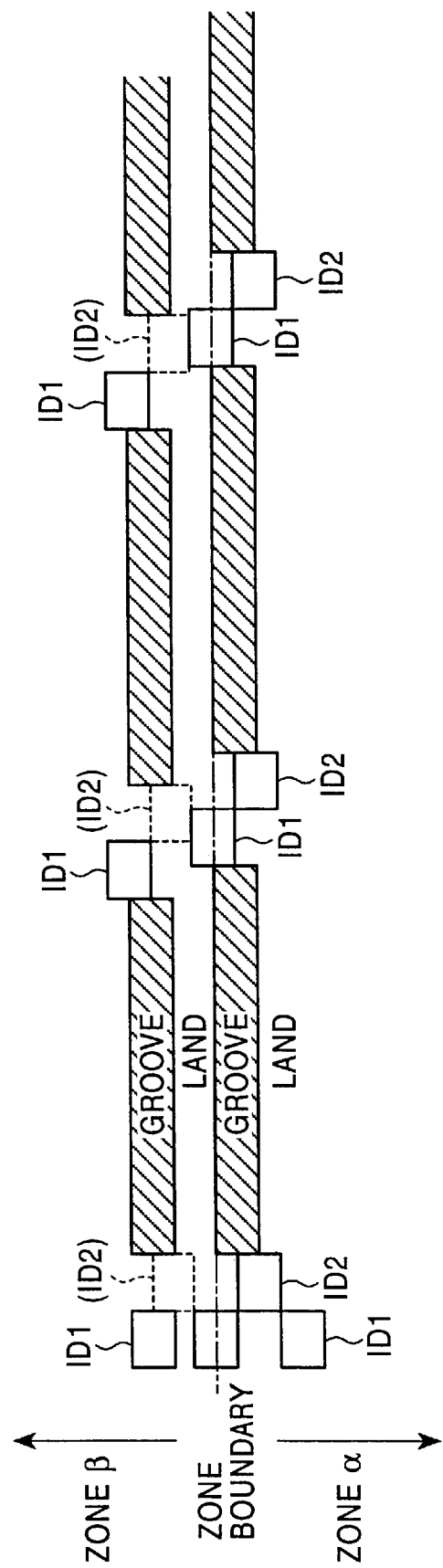
FIG. 13 is an illustration of an address arrangement in a zone boundary on the disk according to the embodiment.

In a case in which the zone CAV method in which zones have different frequencies is used to divide the User Zone into zones #0 to #17 as in the above-described embodiment, on two tracks to be used as a zone boundary, their preformatted headers are radially shifted in position, as shown in FIG. 13.

Assuming that track address ID2 exists on the side of zone β as indicated by the broken line shown in FIG. 13, the broken-line-indicated address ID2 obtains a sufficient pitch with respect to track address ID1 on the side of zone α.

The formation of the radially shifted headers causes several physical tracks from the zone boundary to have crosstalk due to optical phase difference. This affects servo-control and an error rate.

Accordingly, in this embodiment, by preventing the broken-line-indicated address ID2 shown in FIG. 13 from being generated, the crosstalk due to optical phase difference is avoided.

For example, on one physical track tangent to zone α on the side of zone β, the address ID2 to be displaced to the side of zone α is not formed.

This can avoid crosstalk since pits that correspond to the address ID1 and the address ID2 on adjacent tracks are not mutually adjacent.

On the side of zone β (outer circumferential side), no address ID2 may be formed over a plurality of physical tracks.

Obviously, on the side of zone α (inner circumferential side), no address ID1 may be formed in a range of one to a plurality of physical tracks.

For using the disk, PBAs and LBAs are necessary.

As to the disk having the above-described format in this embodiment, a pair of sectors exists in which a land track and a groove track have identical physical addresses. Accordingly, a technique is considered which uses logical addresses to distinguish between the sectors.

Assignment of logical addresses is as follows: a logical address at the start of the User Area on a groove track or a land track in units of zones is used as a minimum LBA when logical addresses are assigned; after assigning the logical addresses to the zone end, the logical addresses are subsequently assigned from the start of another track; a logical address at the zone end is used as a maximum LBA in the zone; and the next LBA is sequentially assigned to the first track in the start of the next zone.

Figure 14:
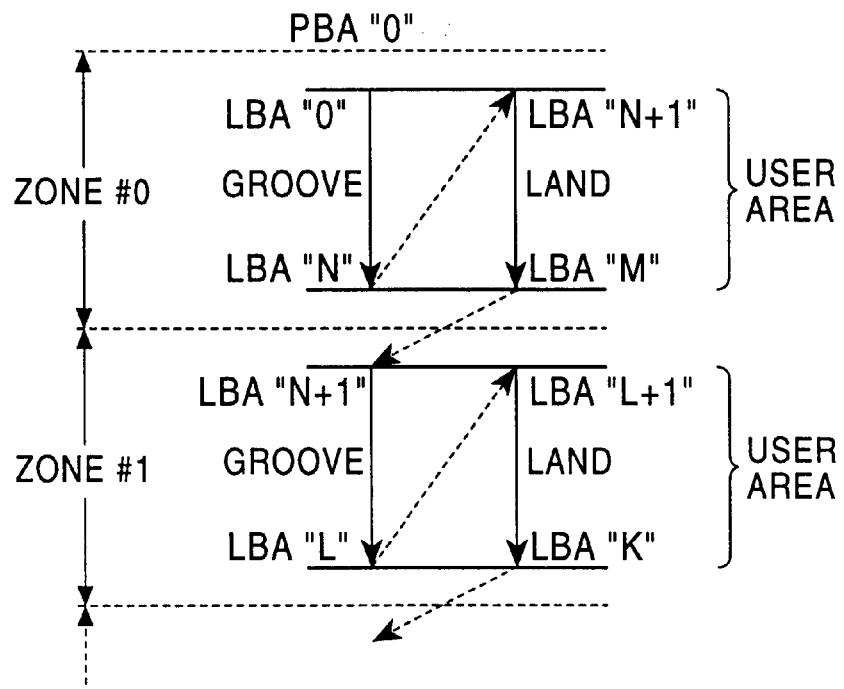
FIG. 14 is an illustration of assignment of logical addresses on the disk according to the embodiment.

For example, as shown in FIG. 14, first, in zone #0, PBAs "0" to "N" are assigned to groove tracks. Second, LBA "N+1" is assigned to the first land track, and LBA "M" is assigned to the end land track in zone #0.

Next, LBAs "M+1" to "L" are assigned to the first groove track to the end groove track in zone #1. LBA "L+1" is assigned to the first land track in zone #1, and LBA "K" is assigned to the end land track in zone #1.

By assigning LBAs as described above, the User Zone can be sequentially accessed from the outermost circumferential side.

Otherwise, LBAs may be separately assigned to groove tracks and land tracks in a zone.

Figure 15:
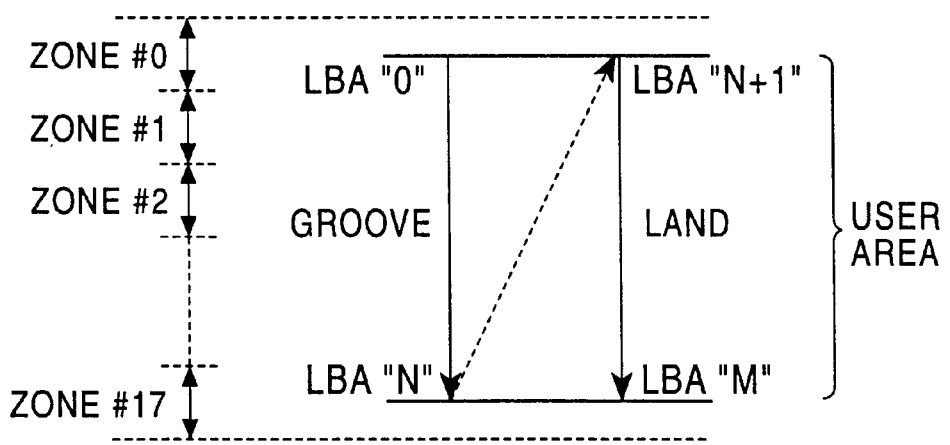
FIG. 15 is an illustration of assignment of logical addresses on the disk according to the embodiment.

For example, as shown in FIG. 15, LBAs "0" to "N" are assigned to groove tracks in zones #0 to #17, LBA "N+1" is assigned to the first land track in zone #0, and LBA "M" is assigned to the end land track in zone #17.

Moreover, the User Zone can be divided into physical zones and logical zones.

The physical zones mean zones conventionally classified by purposes, such as areas in which reading frequencies are identical, the User Zone, and the Control Track SP Zone. Among the physical zones, sectors that are divided into groove tracks and land tracks are treated as logical zones.

This can use units of the conventional concept of zone to manage servo-parameters and parameter relating to writing and reading. Accordingly, firmware resources of the past can be easily applied.

As described above, in a case in which the land/groove writing method and the MSR technique are employed, by efficiently arranging the address ID1 and the address ID2 in the preformatted header of a sector, the redundancy of the preformatted header can be minimized, and a problem such as crosstalk can be solved.

The redundancy of the preformatted region is influenced not only by the header of each sector but also by a preformatted area such as the Inner Control Track SPF Zone shown in FIG. 1.

In the Inner Control Track SPF Zone, disk information such as a laser wavelength, the revolution of a spindle motor, and optimal laser power, and system information such as a final logical address number, and a data length per sector are written in the form of prepits in the disk producing process. Obviously, no MSR effects can be obtained in the Inner Control Track SPF Zone.

Accordingly, all or part of the preformatted areas is formed as an MO area, and in a checking process after disk production, the disk information and the system information are written by a dedicated recorder using the MSR technique.

This can increase the density of also the written disk information and system information, reducing the redundancy of the preformatted region.

In this case, firmware must be designed so that the magneto-optically written disk information and system information cannot be rewritten by a general disk drive unit.

When the disk information and the system information are written in the checking process, a medium-dependant variable that is unique to a vendor is arbitrarily written. In other words, disks of various types can be produced without changing a disk stamper.

4. Construction of Disk Drive Unit

Figure 16:
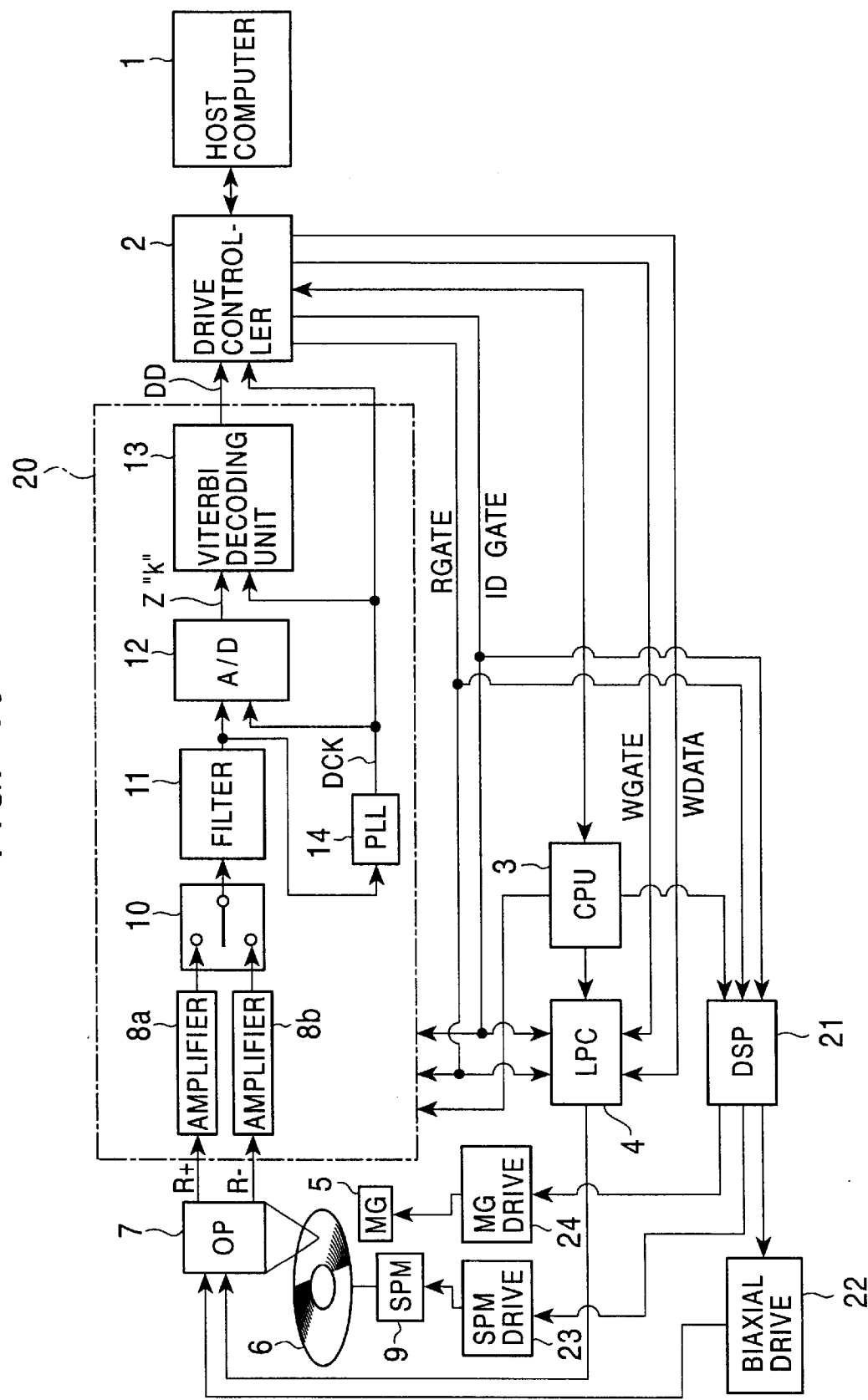
FIG. 16 is a block diagram showing a disk drive unit for the disk according to the embodiment.

A construction of a disk drive unit that performs a writing/reading operation adapted for the above-described disk is shown in FIG. 16.

Magneto-optical-disk reading units use the bit-byte decoding method and Viterbi decoding method in the RF-signal reproduction system. The above disk drive unit has a reproduction system that performs Viterbi decoding.

An optical head 7 and a bias magnet 5 operate to perform information writing, information reading, and information erasure on the above-described disk (hereinafter referred to as the "disk 6") while it is being rotated by the spindle motor 9 in the disk drive unit.

A biaxial mechanism and a sled mechanism, which are not shown, perform the positional control (seeking, tracking servo-control, and sled servo-control) of the optical head 7 and the bias magnet 5 in the writing, reading, and erasing modes, and the tracking servo-control of a laser beam from the optical head 7.

The biaxial mechanism holds an objective lens as an laser output end in the optical head 7 so that the objective lens can move in focussing and tracking directions. The biaxial mechanism is formed by a focussing coil and a tracking coil. A biaxial drive 22 applies driving currents to the focussing coil and the tracking coil.

The sled mechanism is used to radially move both the optical head 7 and the bias magnet 5, and is driven by a sled drive (not shown).

The spindle motor 9 is driven by a spindle drive 23. The spindle drive 23 is servo-controlled to have constant angular velocity rotation.

A drive controller (hereinafter referred to as a "controller") 2 functions as a master controller for the disk drive unit to control various operations, and is part of the disk drive unit which communicates with a host computer 1. Specifically, in accordance with a writing instruction from the host computer 1, the controller 2 controls the operation of writing supplied information to the disk 6, and in accordance with an instruction from the host computer 1, the controller 2 controls the operation of reading requested data from the disk 6 and transferring the read data to the host computer 1. The controller 2 also has encoding and decoding functions.

Based on an instruction from the controller 2, a central processing unit (CPU) 3 controls other component units for performing a writing/reading Operation.

A DSP 21 functions as a servo-processor to control the biaxial drive 22, the spindle drive 23, and the sled drive (not shown).

The bias magnet 5 that applies an external magnetic field to the disk 6 is supplied with a driving current from the a magnet drive 24. The DSP 21 also controls the application of the current by the magnet drive 24, as described later.

In the writing mode, in accordance with an instruction from the host compute 1, the controller 2 receives user data to be written, and generates the RLL (1,7) code as encoded data by performing encoding based on the user data as information. The encoded data is supplied as data WDATA to a laser power controller (LPC) 4.

The controller 2 uses a WGATE signal to instruct the LPC 4 about an emitting operation (as a writing mode) and its timing.

In each of the writing, reading, and erasing modes, the LPC 4 generates a laser-driving current so as to control the optical head 7 to emit a laser beam. The level of the laser beam emitted in each of the writing, reading, and erasing modes, in other words, the laser-driving current is set in accordance with an instruction from the CPU 3.

When the WGATE signal is used to instruct writing, the LPC 4 performs writing by, in response to the supplied data WDATA, controlling the laser power of the optical head 7, and forming pits having magnetic polarities. In this recording, the bias magnet 5 supplies a bias magnetic field to the disk 6.

In the reading mode, the following operations are performed under control of the controller 2 and the CPU 3.

The controller 2 controls the reading operation by supplying an RGATE signal and an IDGATE signal to each of the LPC 4 and an RF block 20.

In other words, the controller 2 uses the RGATE signal to instruct the LPC 4 to perform continuous emitting using laser power as a reading level, and instructs the RF block 20 to perform a reading process.

In accordance with the existence of the header and MO area in the sector format of the disk 6, the IDGATE signal designates operation timing in each area, and in accordance with the timing, the LPC 4 and the RF block 20 operate. For example, the controller 2 outputs the IDGATE signal as a signal that represents a period corresponding to the MO area (data area).

As described above, in the MO area on the disk 6, the film corresponding to the MSR technique is formed.

In the reading mode, the LPC 4 generates the laser-driving current in response to the RGATE signal, and controls the optical head 7 to execute the output of the laser beam for the reading operation.

At this time, the bias magnet 5 also performs the application of a magnetic field in response to the RGATE signal. The operation is described later.

The optical head 7 emits the laser beam to the disk 6, and receives reflected light from the disk 6. By operational processing based on the amount of the reflected light, various signals are generated, such as a sum signal R+ and a differential signal R- between a P-polarized component and an S-polarized component, and a focussing error signal and a tracking error signal which are not shown.

The reading of information from the MO area on the disk 6 is performed by the MSR technique.

The sum signal R+ is supplied to a selector switch 10 after being adjusted in gain, etc. The differential signal R- is supplied to the selector switch 10 after being adjusted in gain, etc. The gain setting in the amplifiers 8a and 8b is performed by the CPU 3.

The focussing error signal and the tracking error signal, which are not shown, are supplied to the DSP 21 for servo-control.

Specifically, based on the focussing error signal and the tracking error signal, the DSP 21 supplies a focus-driving signal and a tracking-driving signal to the biaxial drive 22, whereby a driving current in accordance with the tracking-driving signal is supplied.

The DSP 21 generates a sled-driving current from the tracking error signal, and controls the sled drive (not shown) to execute the operation of the sled mechanism.

The selector switch 10 performs a selecting operation in response to the IDGATE signal, and supplies the sum signal R+ or the differential signal R−. During a period in which a signal read from the header in the sector format of the disk 6 is supplied to the selector switch 10, the sum signal R+ is supplied to a filter unit 11. Also, during a period in which a signal read by the MSR technique from the MO area in which data are magneto-optically written, the differential signal R− is supplied to the filter unit 11.

The filter unit 11 includes a low-pass filter that eliminates noise and a waveform equalizer that equalizes waveform. The signal input to the filter unit 11 is equalized to have partial response characteristics adapted for the Viterbi decoding by the Viterbi decoding unit 13.

The analog-to-digital (A/D) converter 12 converts the output of the filter unit 11 from analog to digital form in accordance with a reading clock signal DCK, and outputs a read signal value Z(k).

The Viterbi decoding unit 13 generates decoded data DD by using the Viterbi decoding method based on the read signal value Z(k). The decoded data DD is a maximum likelihood decoding string for the written data. Accordingly, when no decoding error occurs, the decoded data DD matches the written data.

The decoded data DD is supplied to the controller 2. As described above, the written data is a code generated by encoding from the user data, such as channel encoding. Thus, when the decoding error rate is sufficiently low, the decoded data DD can be regarded as written data as a code. The controller 2 reproduces the user data, etc., by performing decoding processing that corresponds to encoding such as the above channel encoding.

A reading clock signal DCK for the reproduction is generated by a PLL unit 14. Specifically, the output of the filter unit 11 is supplied to the PLL unit 14, and the PLL unit 14 generates the reading clock signal DCK by performing a PLL operation in response to the supplied signal.

The reading clock signal DCK is supplied to the controller 2, the AID converter 12, and the Viterbi decoding unit 13, and they operate with timing in accordance with the reading clock signal DCK.

5. Writing/Reading Operation

Figure 17:
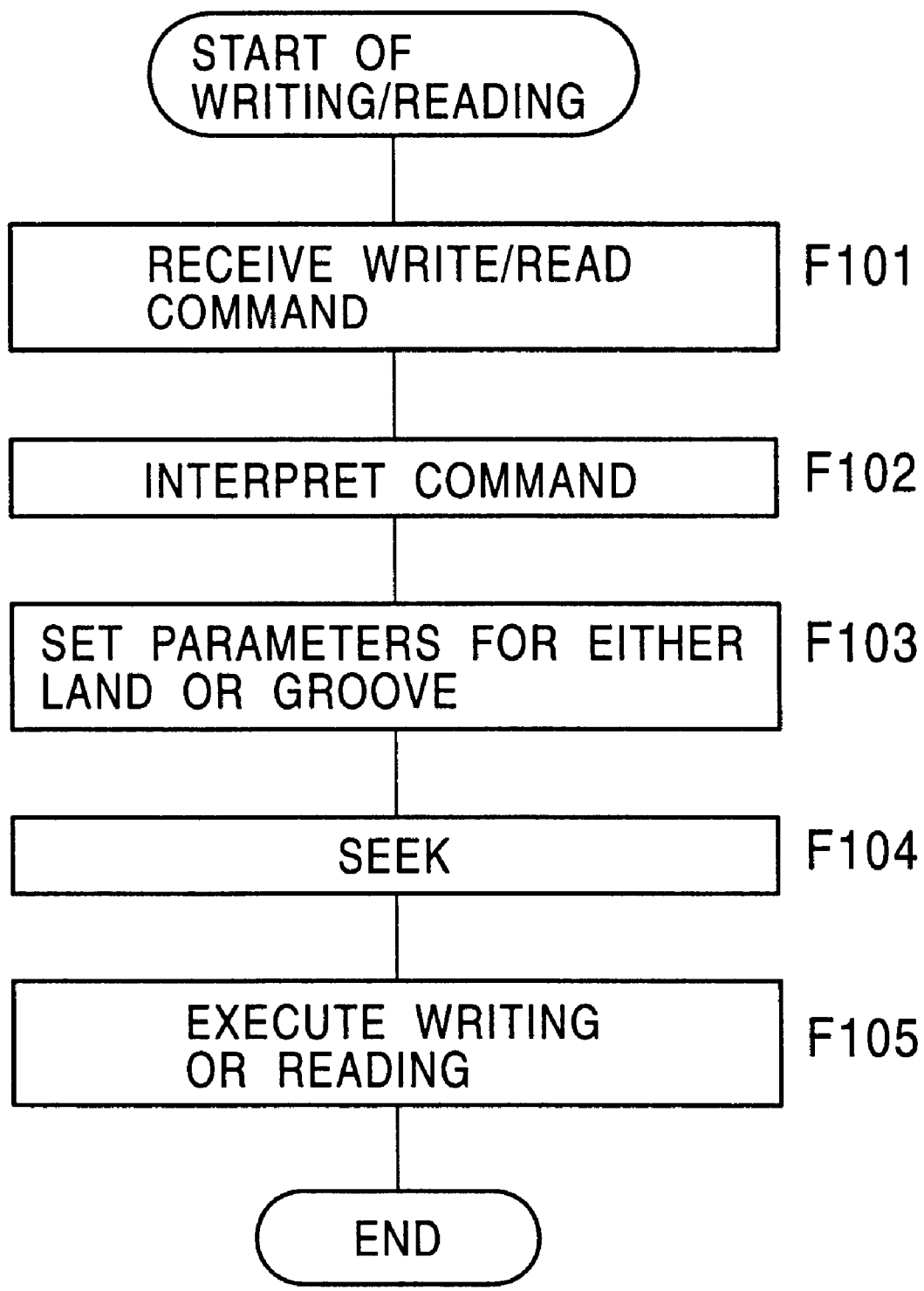
FIG. 17 is a flowchart illustrating a writing/reading operation in the disk drive unit shown in FIG. 16.

FIG. 17 shows a flowchart of the writing or reading operation on the disk 6 by the disk drive unit.

When receiving a write or read command from the host computer 1 in step F101, the controller 2 interprets the command in step F102.

The write or read command is transmitted, with a start address (logical address) at which writing or reading should be started and a data length from the start address.

The controller 2 understands, from the transmitted start address before the command, whether land tracks or groove tracks should be accessed.

The controller 2 transforms the start address to an address (PBA) as an access destination on the disk 6.

Subsequently, the controller 2 sets parameters for either the land or groove tracks.

Specifically, in accordance with whether land track accessing or groove track accessing is performed, the controller 2 sets disk-control parameters, servo-system parameters, reading-system constants and parameters, writing-system constants and parameters, and a laser power value. The CPU 3 uses each of the set values to control the corresponding unit.

In step F104, the DSP 21 is used to perform seeking (accessing) to the start address.

In accordance with whether the access destination designates a land track or a groove track, the polarity of the tracking-error signal is inverted.

On reaching an address as the access destination, the optical head 7 performs writing or reading in step F105.

Specifically, for the write command, the optical head 7 operates to write the data transmitted from the host computer 1, and for the read command, the optical head 7 operates to read and transfer data from the disk 6 to the host computer 1.

In the process of the operation, determination of an address in seeking mode and determination of an address in the writing or reading mode are performed by reading the address ID1 and the address ID2 arranged in a staggered form.

Although a disk according to an embodiment of the present invention and a disk drive unit therefor have been described, the present invention is not limited to the above-described disk format and construction, etc., but may be obviously modified within the gist of the present invention.

What is claimed is:

1. A disk recording medium comprising recording tracks including groove tracks and land tracks that each have sectors as data units, wherein:
    a) each of said sectors includes:
        1) a preformatted-data-recorded header area that includes a first address and a second address that have identical address numbers and that are radially displaced from each other on opposite sides of a center line of one groove track or one land track; and
        2) a writing/reading area in which data is written or read; wherein:
    a plurality of zones are radially formed on said disk recording medium; and
    only one of said first address and said second address is positioned in a boundary area between adjacent zones.

2. A disk recording medium according to claim 1, wherein:
    one of said first address and said second address corresponds to a sector on one groove track, and
    the other one of said first address and said second address corresponds to a sector on one land track.

3. A disk recording medium according to claim 1, wherein:
    in said writing/reading area, a recording film for use in reading by a magnetically induced super resolution technique is formed.

4. A disk recording medium comprising recording tracks including groove tracks and land tracks that each have sectors as data units, wherein:
    a) each of said sectors includes:
        1) a preformatted-data-recorded header area that includes a first address and a second address that have identical address numbers and that are radially displaced from each other on opposite sides of a center line of one groove track or one land track; and 2) a writing/reading area in which data is written or read; wherein:

a plurality of zones are radially formed on said disk recording medium; and in at least one zone, different logical addresses are assigned to said groove tracks and said land tracks.

5. A disk recording medium according to claim 4, wherein:

one of said first address and said second address corresponds to a sector on one groove track, and the other one of said first address and said second address corresponds to a sector on one land track.

6. A disk recording medium according to claim 4, wherein:

in said writing/reading area, a recording film for use in reading by a magnetically induced super resolution technique is formed.

7. A disk drive unit for use with a disk recording medium that has recording tracks including groove tracks and land tracks that each have sectors as data units, wherein each of said sectors includes:

1) a preformatted-data-recorded header area that includes a first address and a second address that have identical address numbers and that are radially displaced from each other on opposite sides of a center line of one groove track or one land track; and 2) a writing/reading area in which data is written or read; said disk drive unit comprising:

a) head means for writing/reading information to/from said groove tracks and said land tracks; and b) control means for controlling said head means to perform a writing operation or a reading operation based on a sector address on the groove track or a sector address on the land track, the sector being determined using the address values read by said head means at said first address and said second address;

c) servo means for switching scanning modes of writing or reading by said head means, the scanning modes corresponding to the scanning of said groove tracks and the scanning of said land tracks;

wherein said control means determines, based on the scanning mode switched by said servo means and the two address values at said first address and said second address, the sector address on the groove track or the sector address on the land track.

8. A disk drive unit according to claim 7, wherein the two address values are identical for one of the groove track and the land track, and have a predetermined differential value for the other one of the groove track and the land track.

9. A disk drive unit for use with a disk recording medium that has recording tracks including groove tracks and land tracks that each have sectors as data units, wherein each of said sectors includes:

1) a preformatted-data-recorded header area that includes a first address and a second address that have identical address numbers and that are radially displaced from each other on opposite sides of a center line of one groove track or one land track; and 2) a writing/reading area in which data is written or read; said disk drive unit comprising:

a) head means for writing/reading information to/from said groove tracks and said land tracks; and b) control means for controlling said head means to perform a writing operation or a reading operation based on a sector address on the groove track or a sector address on the land track, the sector being determined using the address values read by said head means at said first address and said second address; wherein:

a plurality of zones which are radially formed on the said disk recording medium; and when said head means scans either the groove track or the land track, said control means specifies one zone based on the difference between the two address values read at said first address and said second address.

* * * * *

UNITED STATES PATENT AND TRADEMARK OFFICE
CERTIFICATE OF CORRECTION

PATENT NO.   : 6,487,144 B2
DATED         : November 26, 2002
INVENTOR(S)  : Masayoshi Nagata et al.

It is certified that error appears in the above-identified patent and that said Letters Patent is hereby corrected as shown below:

Column 8,
Line 15, change "corresponding" to -- correspond --.
Line 28, change "described" to -- describe --.

Column 13,
Line 44, change "an" (second occurrence) to -- a --.

Signed and Sealed this

Eleventh Day of March, 2003

JAMES E. ROGAN
*Director of the United States Patent and Trademark Office*